(12) United States Patent
Omata et al.

(10) Patent No.: US 10,817,092 B2
(45) Date of Patent: Oct. 27, 2020

(54) ORGANIC ELECTROLUMINESCENCE MODULE, SMART DEVICE, AND ILLUMINATION DEVICE

(71) Applicant: Konica Minolta, Inc., Tokyo (JP)

(72) Inventors: Kazuyoshi Omata, Kofu (JP); Tsukasa Yagi, Kobe (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 16/083,224

(22) PCT Filed: Nov. 28, 2016

(86) PCT No.: PCT/JP2016/085095
§ 371 (c)(1),
(2) Date: Sep. 7, 2018

(87) PCT Pub. No.: WO2017/154278
PCT Pub. Date: Sep. 14, 2017

(65) Prior Publication Data
US 2019/0079619 A1 Mar. 14, 2019

(30) Foreign Application Priority Data
Mar. 11, 2016 (JP) .................... 2016-047824

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/041* (2013.01); *G06F 3/044* (2013.01); *G06F 3/0416* (2013.01);
(Continued)

(58) Field of Classification Search
CPC ...... G06F 3/044; G06F 3/0412; G06F 3/0416; G06F 2203/04103; G06F 3/0443;
(Continued)

(56) References Cited

U.S. PATENT DOCUMENTS 7,910,842 B2 * 3/2011 Yamauchi ............ H03K 17/962
178/110
2017/0123541 A1 * 5/2017 Omata .................... G06F 3/044

FOREIGN PATENT DOCUMENTS

EP  1986324 A1  10/2008
EP  3154315 A1   4/2017
(Continued)

OTHER PUBLICATIONS

Extended European Search Report dated Dec. 19, 2018 from corresponding EP Application No. 16893602.9.
(Continued)

*Primary Examiner* — Duc Q Dinh
(74) *Attorney, Agent, or Firm* — Lucas & Mercanti, LLP

(57) ABSTRACT

The organic electroluminescence module has a touch function of detecting contact or proximity of an operation body. The module has a touch detection circuit unit with a capacitance touch detection circuit section; and a light emitting element drive circuit unit comprising a light emitting element drive circuit section which drives an organic electroluminescence panel. The organic electroluminescence panel has light emitting areas and a pair of at least two plate electrodes that are internally and mutually opposed. The pair of electrodes is connected to the light emitting element drive circuit unit. One of the pair of electrodes is a touch detection electrode. Either one or both of the pair of electrodes is connected to the touch detection circuit unit. A first electrode of the pair of electrodes is divided into portions while a second electrode of the pair of electrodes is a single piece.

(Continued)

The same potential is applied at least to the divided portions of the first electrode during a touch detection period.

10 Claims, 10 Drawing Sheets

(51) Int. Cl.
  *H05B 33/28* (2006.01)
  *H01L 51/50* (2006.01)
  *H01L 51/52* (2006.01)
(52) U.S. Cl.
  CPC .......... *H01L 51/50* (2013.01); *H01L 51/5012* (2013.01); *H01L 51/5056* (2013.01); *H01L 51/5092* (2013.01); *H01L 51/5206* (2013.01); *H01L 51/5221* (2013.01); *H05B 33/28* (2013.01)
(58) Field of Classification Search
  CPC ...................... G06F 3/0448; G06F 1/16; G06F 2203/04104; G06F 2203/04106; G06F 3/0446; G06F 3/04164; G06F 3/0488; G06F 3/041; G06F 2203/04111; G06F 3/03547; G06F 3/04817; G06F 2203/0339; G06F 2200/1636; G06F 3/041661; G06F 2203/04114; G02F 1/13338; G02F 1/1368; G02F 2001/13629; G02F 2001/134318; G02F 2201/121; G02F 1/1343; G02F 1/13624; H01L 51/50; H01L 51/5221; H01L 51/5206; H01L 2251/5361; H01L 27/323; H05B 33/26

USPC .................................................. 345/173–175
See application file for complete search history.

(56) References Cited

FOREIGN PATENT DOCUMENTS

| | | |
|---|---|---|
| JP | 2008-277517 A | 11/2008 |
| JP | 2012-194291 A | 10/2012 |
| JP | 2013-065429 A | 4/2013 |
| KR | 10-2008-0096384 A | 10/2008 |
| WO | 2015/186266 A1 | 12/2015 |
| WO | WO 2015186266 * 12/2015 ............ G06F 3/044 |
| WO | 2016/031593 A1 | 3/2016 |

OTHER PUBLICATIONS

Written Opinion of the International Searching Authority dated Jan. 31, 2017 from International Application No. PCT/JP2016/085095 and English Translation.

International Search Report dated Jan. 31, 2017 from corresponding International Application No. PCT/JP2016/085095 and English translation.

JPO, Office Action for the corresponding Japanese application No. 2018-503994, dated Feb. 6, 2020, with English translation (6 pages).

KIPO, Office Action for the corresponding Korean patent application No. 10-2018-7021188, dated Apr. 27, 2020, with English translation (9 pages).

* cited by examiner

CAPACITANCE OF ANODE 1 (4A): Cf
CAPACITANCE OF ANODE 2 (4B):
$(Cel \times Cf)/(2Cf+Cel) \approx Cf$ CAPACITANCE OF ANODE 1 (4A): Cf
CAPACITANCE OF ANODE 2 (4B): 0

LIGHT EMITTING AREA 1    LIGHT EMITTING AREA 2

LIGHT EMITTING AREA 1    LIGHT EMITTING AREA 2

ORGANIC ELECTROLUMINESCENCE MODULE, SMART DEVICE, AND ILLUMINATION DEVICE

This application is a 371 of International Application, PCT/JP2016/085095 filed on Nov. 28, 2016, which claimed the priority of Japanese Application, JP 2016-047824 filed Mar. 11, 2016, both applications are incorporated herein by reference.

TECHNICAL FIELD

The present invention relates to an organic electroluminescence module with light emitting areas having a multi-touch function, and a smart device and an illumination device that include the electroluminescence module.

BACKGROUND ART

Conventional planar light sources include light emitting diodes (hereinafter abbreviated as "LEDs") with a light guide plate and organic light emitting diodes (hereinafter abbreviated as organic electroluminescence elements or "OLEDs").

The production of smart devices (e.g. smartphones, tablets, etc.) has been remarkably increasing worldwide since around 2008. For the operability, a key of smart devices has a flat surface. An example of the key is an icon area including a common function key button, which is disposed in a lower part of smart devices. Such a common function key button may be composed of three marks that indicate respectively "home" (illustrated as a square or the like), "back" (illustrated as an arrow or the like) and "search" (illustrated as a magnifying glass or the like).

In terms of improving the visibility of such common function key buttons, a technique is disclosed that involves providing a flat light emitting device, such as an LED light guide plate when an LED or the like is used, inside a smart device in the pattern of marks to be displayed (e.g. see Patent Document 1).

With regard to capacitance information inputting units with an LED light source, a technique is disclosed for stably processing a user input by increasing the sensitivity of a sensor electrode and reliably detecting a change of the capacitance with a sensor circuit (e.g. see Patent Document 2). This technique involves disposing an adhesive layer, having higher permittivity than an air layer with the same shape, between a flexible printed circuit (herein referred to as an FPC) with the sensor electrode and a surface panel in an area out of an icon and the like, so as to improve the accuracy of a detection electrode detecting the capacitance.

With regard to techniques of displaying the icon area, there have been attempts of using a surface-emitting organic electroluminescence device in recent years in replace of the above-described technique using an LED light source in order to further reduce the power consumption and to improve the brightness uniformity of light emission. Such an organic electroluminescence device can function as a displaying device when a mark and the like is printed on a cover glass of the icon area and the organic electroluminescence device is disposed behind the printed area.

Since a touch detecting function is essential to use smart devices, a capacitance detecting device for detecting touch gestures is generally disposed below the cover glass over a display area and the common function key area.

To detect touch gestures, a film or film-like touch sensor is typically used that extends to the size of the cover glass to laminate it. When the thickness of a device is not limited, a glass or glass-like sensor may sometimes be used. In terms of touch detecting techniques, capacitance devices have been widely used in recent years. A technique using an electrode formed in a fine pattern in the x and y axes, which is referred to as a "projected capacitance technique", is used for a main display. This technique enables detecting two or more points, which is so-called "multi-touch" detection.

With regard to the usage of such touch sensors, light emitting devices that has been used in the area of the common function key does not have a touch function. However, development of so-called "in-cell" or "on-cell" displays in recent years strongly urges imparting an independent touch detecting function to a light emitting device of the common functional key.

Particularly in surface-emitting organic electroluminescence devices, a positive electrode, a negative electrode and, if any, a protective metal foil layer of an organic electroluminescence element have a negative effect on detection of a surface capacitance change by the above-described surface capacitance technique. When a touch detecting function (including a hovering detecting function) is imparted to an organic electroluminescence device, an assembly of an electric connecting unit composed of a capacitance detecting circuit and a wiring formed on a flexible substrate, e.g. a touch detection electrode for the touch detecting function composed of a flexible printed circuit (abbreviated as an FPC), has to be disposed as an independent component on the light emitting side along with an organic electroluminescence panel. Therefore, the configuration thereof is significantly limited. This technique of disposing an assembly requires preparing an additional touch detecting device such as an FPC for the touch detecting function. This results in the increased economic strain, the increased thickness of the device, the increased man-hour in the production and the like.

When an anode electrode (also referred to as a positive electrode or simply an "anode") or a cathode electrode (also referred to as a negative electrode or simply as a "cathode") of an organic electroluminescence panel or an organic electroluminescence element is used as a touch detection electrode (hereinafter referred simply as a "detection electrode"), the capacitance during a touch gesture is represented by "Cf+Cel" while the capacitance when no finger is in the proximity is represented by "Cel", where Cf is the capacitance between a touching finger and a touch detection electrode and Cel is the capacitance between the anode electrode and the cathode electrode. However, since the capacitance is normally Cf<Cel, it is difficult to detect a touch gesture.

It has been desired to impart a multi-touch function to smart devices and the like. Multi-touch refers to a method of operation by contacting (touching) or closely moving (hovering) a finger, a touch pen or the like, which enables operation by simultaneously touching multiple points. Contact or proximity at multiple points can be made to input the respective positions and the respective movements to the multi-touch devices. For example, multi-touch finger gesture patterns include double tap, long press, scroll, pan, flick, two-finger tap, two-finger scroll, pinch, spread, rotation and the like.

To impart the multi-touch function that enables a scroll gesture or a tap gesture to in-cell organic electroluminescence elements having a touch detecting function as well as a light emitting function, the anode electrode itself has to be divided into areas.

In organic electroluminescence devices with light emitting areas based on the conventional multi-touch technique as described below with FIG. 1B, a cathode is shared in a floating state while an anode is divided into Anode 1 and Anode 2. However, a problem with such configuration is that it cannot be determined whether a touch gesture is made on Anode 1 or Anode 2.

A possible solution to the problem is to further divide the cathode to form two units of organic electroluminescence elements as illustrated in FIG. 1C. However, this increases the number of wirings and complicates the configuration of the organic electroluminescence device.

Therefore, it has been desired to develop an organic electroluminescence module in which an organic electroluminescence element and a wiring material for driving the element are efficiently arranged, in which a reduction in size and thickness is achieved and which is suitable for smart devices.

PRIOR ART DOCUMENT

Patent Documents

Patent Document 1: JP 2012-194291A
Patent Document 2: JP 2013-065429A

SUMMARY OF INVENTION

Problem to be Solved by Invention

The present invention has been made in view of the above-described problem and circumstances, and an object thereof is to provide a multi-touch detectable organic electroluminescence module which includes an organic electroluminescent element with an electrode having both light emitting function and touch detecting function and a specific control circuit and which enables the small format, a reduction in thickness and a simplification of the production process, and to provide a smart device and an illumination device that include the organic electroluminescence module.

Means for Solving Problems

As a result of keen study for solving the above-described problem, the present inventors have found that the above-described problem can be solved by an organic electroluminescence module having a touch function of detecting, including: a capacitance touch detection circuit unit; and a light emitting element drive circuit unit which drives an organic electroluminescence panel, wherein the organic electroluminescence panel includes light emitting areas and a pair of at least two plate electrodes that are internally and mutually opposed, the pair of electrodes is connected to the light emitting element drive circuit unit, one of the pair of electrodes is a touch detection electrode, and both or either one of the pair of electrodes is connected to the touch detection circuit unit, wherein a first electrode of the pair of electrodes is divided into portions while a second electrode of the pair of electrodes is a single piece, and wherein a same potential is applied at least to the divided portions of the first electrode during a touch detection period.

That is, the problem relating to the present invention is solved by the following means.

1. An organic electroluminescence module having a touch function of detecting contact or proximity of an operation body, including:

a touch detection circuit unit comprising a capacitance touch detection circuit section; and a light emitting element drive circuit unit comprising a light emitting element drive circuit section which drives an organic electroluminescence panel, wherein the organic electroluminescence panel comprises light emitting areas and a pair of at least two plate electrodes that are internally and mutually opposed, the pair of electrodes is connected to the light emitting element drive circuit unit, one of the pair of electrodes is a touch detection electrode, both or either one of the pair of electrodes is connected to the touch detection circuit unit, a first electrode of the pair of electrodes is divided into portions while a second electrode of the pair of electrodes is a single piece, and a same potential is applied at least to the divided portions of the first electrode during a touch detection period.

2. The organic electroluminescence module according to claim 1, wherein the same potential is applied to all of the divided portions of the first electrode and the single piece of the second electrode during the touch detection period.

3. The organic electroluminescence module according to claim 1 or 2, wherein the first electrode, which is divided into the portions, is the touch detection electrode.

4. The organic electroluminescence module according to any one of claims 1 to 3, wherein a light emission period of the organic electroluminescence panel under control of the light emitting element drive circuit section and the touch detection period under control of the touch detection circuit section are separated from each other.

5. The organic electroluminescence module according to any one of claims 1 to 4, wherein a capacitance of the organic electroluminescence panel is undetectable during the touch detection period.

6. The organic electroluminescence module according to any one of claims 1 to 5, wherein a light emission period of the organic electroluminescence panel under control of the light emitting element drive circuit section and the touch detection period under control of the touch detection circuit section are separated from each other, and at least one of the pair of the electrodes is at a floating potential during the touch detection period so that a capacitance of the organic electroluminescence panel is undetectable, and the other of the pair of electrodes is at the same potential.

7. The organic electroluminescence module according to any one of claims 1 to 5, wherein a light emission period of the organic electroluminescence panel under control of the light emitting element drive circuit section and the touch detection period under control of the touch detection circuit section are separated from each other, and the pair of electrodes is at the same potential during the touch detection period so that a capacitance of the organic electroluminescence panel is undetectable.

8. The organic electroluminescence module according to any one of claims 1 to 7, wherein the organic electroluminescence module is driven such that the organic electroluminescence panel is controlled by the light emitting element drive circuit section to continuously emit light while the touch detection period under control of the touch detection circuit section periodically appear.

9. The organic electroluminescence module according to any one of claims 1 to 8, wherein a light emission period comprises a reverse voltage applying period at an end.

10. A smart device including the organic electroluminescence module according to any one of claims 1 to 9.

11. An illumination device including the organic electroluminescence module according to any one of claims 1 to 9.

Advantageous Effects of Invention

With the above-described solution of the present invention, it is possible to provide an organic electroluminescence module which includes an electroluminescence element with an electrode having both light emitting function and touch detecting function and a specific control circuit and which enables the small format, a reduction in thickness and a simplification of the production process, and to provide a smart device and an illumination device that include the organic electroluminescence module.

It is presumed that the technical features and the mechanism of producing the advantageous effects of the organic electroluminescence module having the configuration of the present invention are as follows.

Conventional organic electroluminescence modules used for an icon display area of a smart device are constituted by an organic electroluminescence panel that includes a pair of oppositely disposed electrode units and a touch detection electrode for detecting touch gestures, e.g. a flexible printed circuit (FPC), which are independent assemblies respectively for the light emitting function and the touch detecting function. This results in the thick arrangement and makes it very difficult to achieve a small format.

While it is desired to impart the multi-touch function to smart devices and the like, imparting the multi-touch function that enables a scroll gesture or a tap gesture on in-cell organic electroluminescence elements having a touch detecting function as well as a light emitting function requires dividing the anode electrode itself into areas.

In organic electroluminescence devices having light emitting areas as described in FIG. 1B below, the cathode is shared in a floating state in touch detection periods while the anode is divided into Anode 1 and Anode 2. However, in this configuration, Anode 1 and Anode 2 are electrically connected to each other via the capacitance Cel of the organic EL element. Since the capacitances are "Cel>Cf" where Cf is the capacitance between a touching finger and a touch detection electrode, it cannot be determined whether a touch gesture is made on Anode 1 or Anode 2. In the technique of further dividing the cathode to form two units of organic electroluminescence elements, the number of wirings is increased, and the configuration of the organic electroluminescence device is complicated. Therefore, it has been required to develop a multi-touch detectable organic electroluminescence module in which an organic electroluminescence element and a wiring material for driving the element are efficiently arranged, in which a reduction in size and thickness is achieved and which is suitable for smart devices.

The present inventors conducted a keen study for imparting the multi-touch technique to an organic electroluminescence module. As a result, as described later with FIG. 2A, FIG. 2B, FIG. 3A and FIG. 3B, stable and high precision multi-touch is achieved in an organic electroluminescence module that includes: a touch detection circuit unit including a capacitance touch detection circuit section; and a light emitting element drive circuit unit including a light emitting element drive circuit section which drives an organic electroluminescence panel, wherein the organic electroluminescence panel includes light emitting areas and a pair of at least two plate electrodes that are internally and mutually opposed, the pair of electrodes is connected to the light emitting element drive circuit unit, one of the pair of electrodes is a touch detection electrode, and both or either one of the pair of electrodes is connected to the touch detection circuit unit, wherein a first electrode of the pair of electrodes is divided into portions while a second electrode of the pair of electrodes is a single piece, and wherein a same potential is applied at least to the divided portions of the first electrode during a touch detection period.

In the present invention, the same potential is applied at least to the portions of the divided electrode during the touch detection period so as to eliminate the potential difference between the portions of the divided electrode. Accordingly, the influence of the capacitance Cel of the organic EL elements is eliminated, and it is possible to determine whether a touch gesture is performed on Anode 1 or Anode 2. Therefore, multi-touch can be detected with high precision.

BRIEF DESCRIPTION OF DRAWINGS

The advantages and features provided by one or more embodiments of the invention will become more fully understood from the detailed description given hereinbelow and the appended drawings which are given by way of illustration only, and thus are not intended as a definition of the limits of the present invention.

EMBODIMENTS FOR CARRYING OUT INVENTION

Figure 1A:
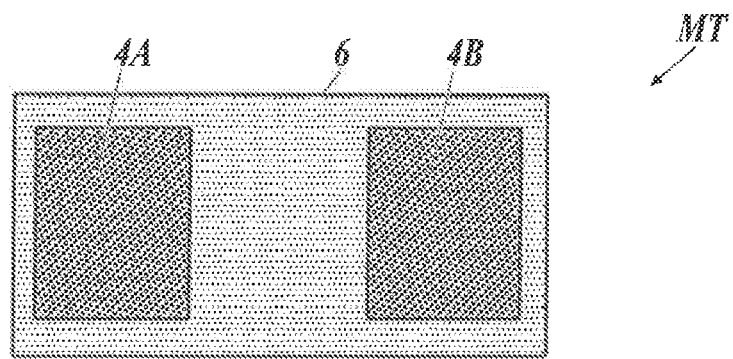
FIG. 1A is a plan view of an example configuration of conventional multi-touch techniques.

Hereinafter, one or more embodiments of the present invention will be described with reference to the drawings. However, the scope of the invention is not limited to the disclosed embodiments. The organic electroluminescence module (hereinafter also referred to as the "organic EL module") of the present invention, which has a touch function of detecting contact or proximity of an operation body, includes: a capacitance touch detection circuit unit; and a light emitting element drive circuit unit which drives an organic electroluminescence panel (hereinafter also referred to as an "organic EL panel"), wherein the organic electroluminescence panel comprises light emitting areas and a pair of at least two plate electrodes that are internally and mutually opposed, one of the pair of electrodes is a touch detection electrode, and both or either one of the pair of electrodes is connected to the touch detection circuit unit, wherein a first electrode of the pair of electrodes is divided into portions while a second electrode of the pair of electrodes is a single piece, and wherein a same potential is applied at least to the divided portions of the first electrode during a touch detection period. This feature is the same or corresponding technical feature among the claims.

With regard to the embodiments of the present invention, it is preferred in terms of achieving the advantageous effects of the present invention that the same potential is applied to all of the divided portions of the first electrode and the single piece of the second electrode during the touch detection period since a multi-touch gesture can be surely detected without an error.

It is preferred that the first electrode, which is divided into the portions, is the touch detection electrode since a multi-touch gesture can be surely detected without an error.

It is preferred that a light emission period of the organic electroluminescence panel under control of the light emitting element drive circuit section and the touch detection period under control of the touch detection circuit section are separated from each other, since the high detection accuracy can be achieved.

It is preferred that a capacitance of the organic electroluminescence panel is undetectable during the touch detection period, since the high detection accuracy can be achieved.

It is preferred that a light emission period of the organic electroluminescence panel under control of the light emitting element drive circuit section and the touch detection period under control of the touch detection circuit section are separated from each other, at least one of the pair of the electrodes is at a floating potential during the touch detection period so that a capacitance of the organic electroluminescence panel is undetectable, and the pair of electrodes is at the same potential, since the light emission period and the touch detection period can be separated more clearly.

It is preferred that a light emission period of the organic electroluminescence panel under control of the light emitting element drive circuit section and the touch detection period under control of the touch detection circuit section are separated from each other, and the pair of electrodes is at the same potential during the touch detection period so that a capacitance of the organic electroluminescence panel is undetectable, since the light emission period and the touch detection period can be separated more clearly.

It is preferred that the organic electroluminescence module is driven such that the organic electroluminescence panel is controlled by the light emitting element drive circuit section to continuously emit light while the touch detection period under control of the touch detection circuit section periodically appear, since simplification of the circuit and the effective sensing function can be achieved.

It is preferred that a light emission period comprises a reverse voltage applying period at an end, since the light emission period and the touch detection period can be separated more clearly.

As used herein, an organic electroluminescence element (hereinafter also referred to as an "organic EL element") refers to an element that is constituted by a pair of mutually opposed electrodes and an organic functional layer unit. Further, an organic EL panel refers to a panel in which an organic EL element is sealed with a sealing resin and a sealing member. An organic EL module refers to a module that includes an organic EL panel and a capacitance touch detection circuit unit and a light emitting element drive circuit unit that are connected to the organic EL panel by an electric connecting member, and that has both light emitting function and touch detecting function.

As used herein, "contact or proximity of an operation body" is a method of operation using the operation body such as a finger or a touch pen based on a change of capacitance due to contact (touch) or proximity (hovering) to a touch panel. Hereinafter, detection of such contact (touch) or proximity (hovering) is generally referred to as "touch detection".

Hereinafter, the components of the present invention, and modes and embodiments for carrying out the present invention will be described in detail with the drawings. As used herein, a hyphen used in a numerical range means that the numbers before and after the hyphen are included in the numerical range respectively as the lower and upper limits. In the description of drawings, numbers in parenthesis after components represent their reference signs in the drawings.

Configuration of Organic EL Module

The organic electroluminescence module of the present invention, which has a touch function of detecting contact or proximity of an operation body such as a finger or a touch pen, includes: a touch detection circuit unit including a capacitance touch detection circuit section; and a light emitting element drive circuit unit including a light emitting element drive circuit section which drives an organic electroluminescence panel, wherein the organic electroluminescence panel includes light emitting areas and a pair of at least two plate electrodes that are internally and mutually opposed, the pair of electrodes is connected to the light emitting element drive circuit unit, one of the pair of electrodes is a touch detection electrode, and both or either one of the pair of electrodes is connected to the touch detection circuit unit, wherein a first electrode of the pair of electrodes is divided into portions while a second electrode of the pair of electrodes is a single piece, and wherein a same potential is applied at least to the divided portions of the first electrode during a touch detection period.

A specific example of the organic EL panel (2) of the organic EL module (1) of the present invention is as follows. Divided anode electrodes (4A and 4B, positive electrodes) and an organic functional layer unit (5) are laminated on a transparent substrate (3), and a cathode electrode (6, negative electrode) as a common electrode is laminated on the organic functional layer unit (5), so that an organic EL element with two light emitting areas are formed as described in FIG. 4 below. The organic EL element is sealed with sealing adhesive (7) at the outer periphery thereof, and a sealing member (8) is disposed on the surface thereof.

More specific components which are preferred are as follows.

1) The same potential is applied to all of divided portions of the first electrode among a pair of plate electrodes and a single piece of the second electrode among the pair of electrodes during touch detection period.

2) The light emission period and the touch detection period are temporally separated from each other.

3) The first electrode in 1), which is divided into the portions, is a touch detection electrode.

4) The influence of the capacitance (Cel) of the organic EL element is eliminated during the touch detection periods.

5) The influence between the divided portions of the electrodes is eliminated during the touch detection periods.

6) The same potential is applied to the electrodes during the touch detection periods so that the influence of the capacitance (Cel) of the organic EL element is eliminated and that the influence between the divided portions of the electrodes is eliminated.

Overall Configuration of Organic EL Module

Prior to description of the overall configuration of the organic EL module of the present invention, the schematic configuration of a conventional organic EL panel will be described for comparison.

Multi-Touch Technique of Conventional Organic EL Panel

Figure 1B:
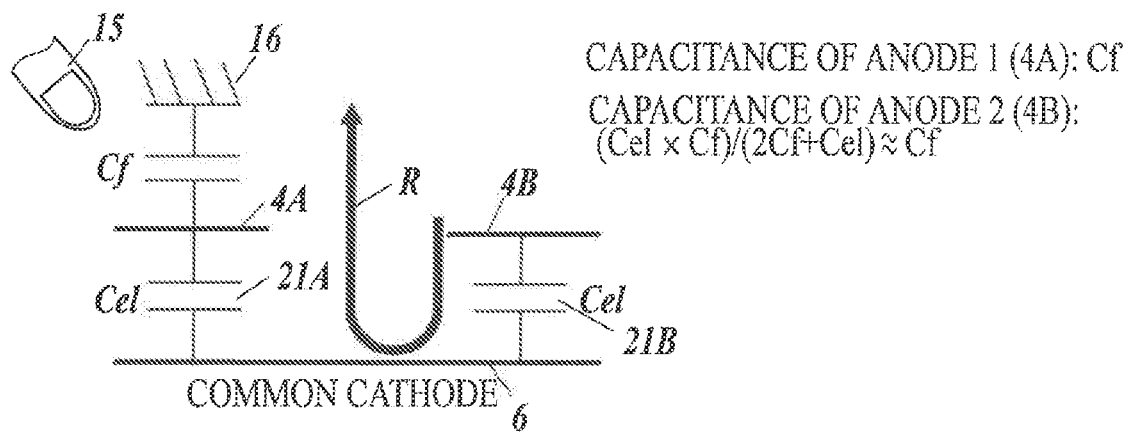
FIG. 1B is a schematic view of an example of the conventional multi-touch technique in FIG. 1A.
Figure 1C:
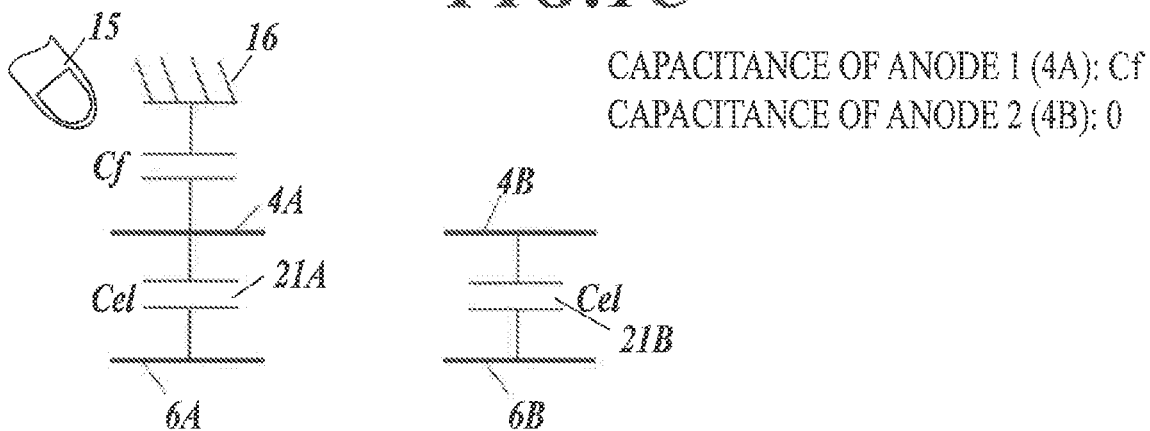
FIG. 1C is a schematic view of another example of conventional multi-touch techniques.

FIG. 1A to FIG. 1C are schematic views of an example of a conventional multi-touch technique, illustrating a method of determining a multi-touch.

In a multi-touch area (MT) as illustrated in FIG. 1A, two separate anodes (4A and 4B) are disposed above a common cathode (6) so that two light emitting areas are formed.

In the configuration having the two light emitting areas as illustrated in FIG. 1A and FIG. 1B, the cathode (6) is constituted by a common electrode (common cathode) while Anode 1 (4A) and Anode 2 (4B) are separately disposed respectively in the two light emitting areas. The cathode (6) is not electrically connected to anywhere, i.e. is in the floating state or has a capacitance of "0".

For example, when a finger (15) touches Anode 1 (4A), the capacitance at Anode 1 (4A) becomes Cf due to the finger. In contrast, the capacitance at Anode 2 (4B) where no finger touches is represented by (Cel×Cf)/(2Cf+Cel) since the cathode (6) is floating and the capacitance is detected via the route R, which is approximately equal to Cf. That is, there is no difference between the capacitance of touched Anode 1 (4A) and the capacitance of untouched Anode 2 (4B). Therefore, it cannot be determined which anode is touched.

To address the problem, two light emitting areas may be formed respectively by independent pairs of electrodes, which are respectively Anode 1 (4A) and Cathode 1 (6A), and Anode 2 (4B) and Cathode 2 (6B) as illustrated in FIG. 1C, so that independent detection is possible. While this configuration allows multi-touch detection, problems with the configuration in FIG. 1C are that the number of wirings is increased and the configuration of the organic EL device is complicated.

Principle of Multi-Touch Detection by Organic EL Panel of Present Invention

Detection Method 1: Individual Detection by Applying the Same Detection Wave to the Divided Anodes and the Common Cathode: Embodiment 1

Figure 2A:
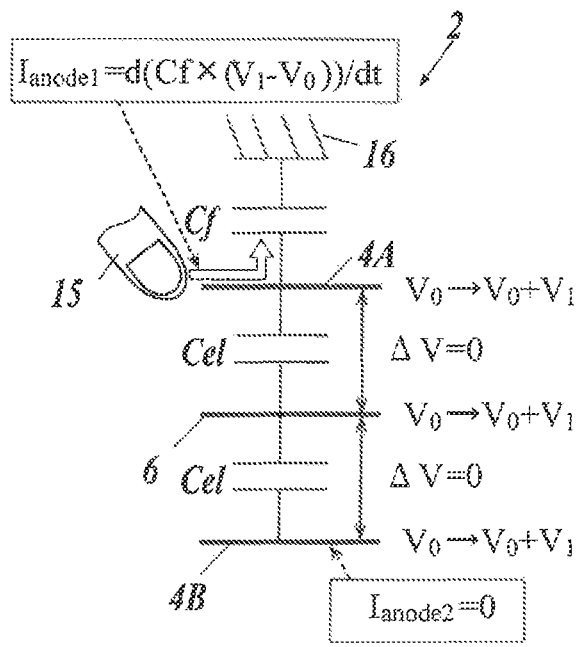
FIG. 2A is a schematic view of an example principle (Embodiment 1, Detection Method 1) of the multi-touch technique of the present invention.
Figure 2B:
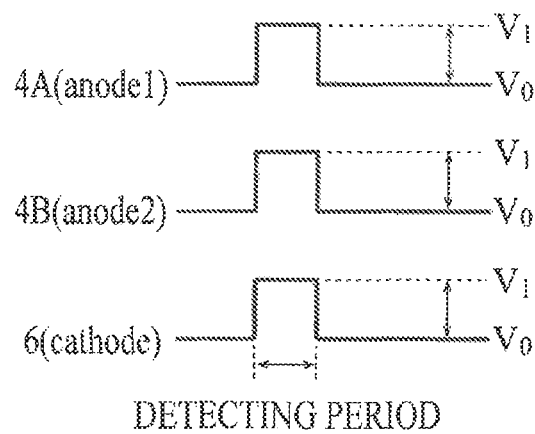
FIG. 2B is a timing chart of an example of the potential of electrodes in Embodiment 1 (Detection Method 1) in FIG. 2A.

FIG. 2A and FIG. 2B are schematic views illustrating an example (Embodiment 1) of the principle of multi-touch detection that is applicable to the present invention.

FIG. 2A is a schematic view of an example for illustrating a touch detection period, in which the organic EL panel (2) includes two light emitting areas, the divided anodes (4A and 4B) and the common cathode (6) are arranged in series, and a finger (15) contacts the anode (4A) that is a touch detection electrode.

When contact (touch) or proximity (hovering) of an operation body such as the finger (15) or a touch pen is detected, the same potential ($V_1$) is applied to all the divided anode (4A and 4B) and the common cathode (6) as illustrated in FIG. 2B. In this period, the potential difference $\Delta V$ between Anode 1 (4A) and the cathode (6) is "0" since the same potential $V_1$ is applied to both of them as illustrated in FIG. 2A. Similarly, the potential difference $\Delta V$ between Anode 2 (4B) and the cathode (6) is also "0". When the same potential is applied to the electrodes, the capacitance (Cel) of the organic EL element is undetectable.

When a touch gesture with the finger (15) is performed on Anode 1 (4A) while the potential of the electrodes is as described above, the transient current through Anode 1 (4A) becomes $I_{anod1}=d(Cf \times (V_1-V_0))/dt$. In contrast, the transient current through the untouched Anode 2 (4B) is $I_{anod2}=0$. Since the transient current $I_{anod1}$ becomes different from the transient current $I_{anod2}$, it is possible to detect the touch gesture on Anode 1 (4A) from $I_{anod1}$ and $I_{anod2}$.

Detection Method 2: Touch Detection Method with Divided Anodes and Common Cathode, the Cathode Being Floating: Embodiment 2

Figure 3A:
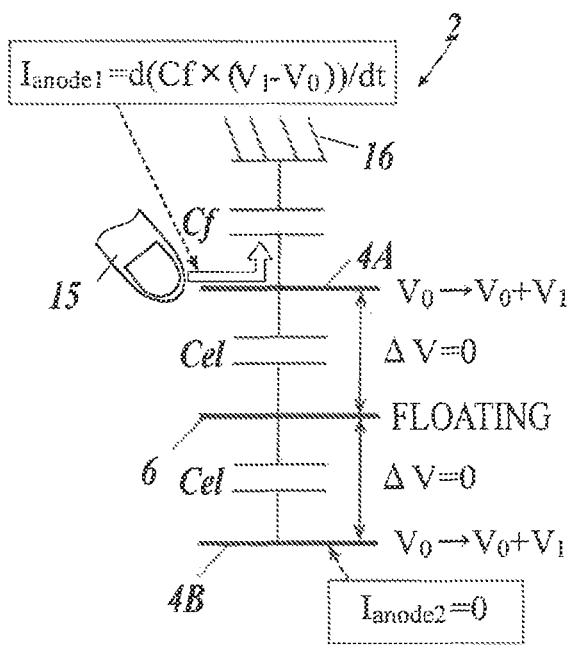
FIG. 3A is a schematic view of another example principle (Embodiment 2 Detection Method 2) of the multi-touch technique of the present invention.
Figure 3B:
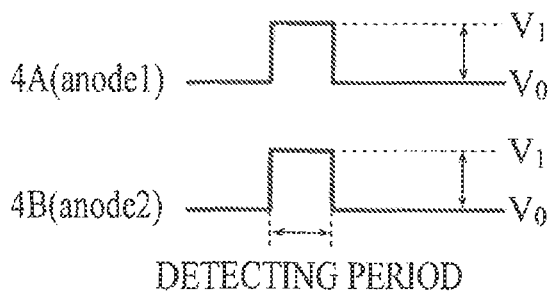
FIG. 3B is a timing chart of an example of the potential of electrodes in Embodiment 2 (Detection Method 2) in FIG. 3A.

FIG. 3A and FIG. 3B are schematic views illustrating another example of the principle of the multi-touch technique that is applicable to the present invention, in which a cathode electrode according to Embodiment 3 is floating.

In an organic EL panel (2) of FIG. 3A, an anode as a positive electrode is divided into two electrodes of Anode 1 (4A) and Anode 2 (4B) as in the above-described configuration in FIG. 2A. Further, a common cathode (6) is provided as the other electrode. The cathode is not connected to the touch detection circuit section, i.e. floating.

In a touch detection period, the same potential ($V_1$) is applied to the divided electrodes of Anode 1 (4A) and Anode 2 (4B) as illustrated in FIG. 3B. As illustrated in FIG. 3A, the potential difference $\Delta V$ between Anode 1 (4A) and the cathode (6) is "0" since the cathode (6) is floating. Similarly, the potential difference $\Delta V$ between Anode 2 (4B) and the cathode (6) is also "0". When the same potential is applied to the two electrodes of Anode 1 (4A) and Anode 2 (4B), the capacitance (Cel) of the organic EL element is undetectable. Since the transient current $I_{anod1}$ becomes different from the transient current $I_{anod2}$, it is possible to detect a touch gesture on Anode 1 (4A) from $I_{anod1}$ and $I_{anod2}$ also with this configuration.

As used herein, a floating (potential) refers to a floating state of the potential in which an electrode is not connected to a power supply or the ground of a device. Since the anode electrode (positive electrode) or the cathode electrode (negative electrode) is at a floating potential during touch detection, the capacitance Cel of the organic EL panel I is undetectable. As a result, it is possible to detect a touch gesture of a finger.

When a touch gesture of the finger (15) is performed on Anode 1 (4A) while the potential of the electrodes is as described above, the transient current through Anode 1 (4A) becomes $I_{anod1}=d(Cf \times (V_1-V_0))/dt$. In contrast, the transient current through untouched Anode 2 (4B) is $I_{anod2}=0$. Since the transient current becomes different between the electrodes, it is possible to detect the touch gesture individually.

Schematic Configuration View of Organic EL Module

Next, the schematic configuration of the organic EL module of the present invention will be described.

First, the overall configuration of the organic EL module with two light emitting areas having a multi-touch detecting function will be described with a cross-sectional view.

Schematic Configuration of Organic EL Module Applicable to Detection Method 1: Embodiment 1

Figure 4:
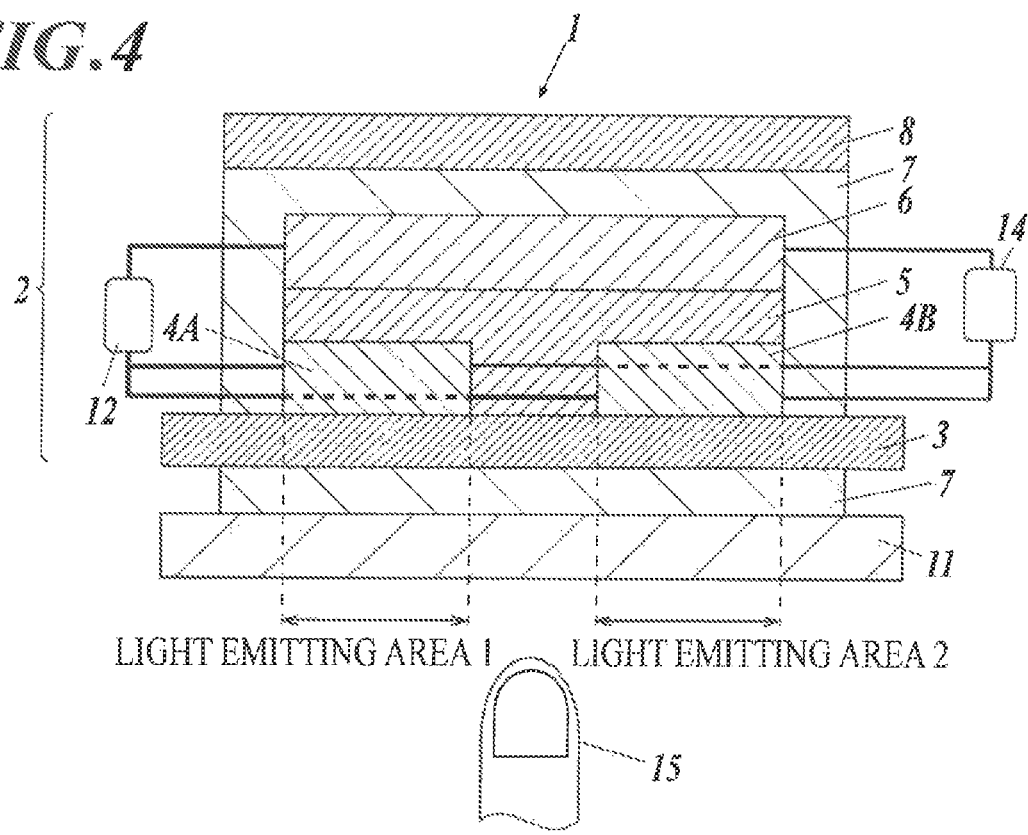
FIG. 4 is a schematic cross-sectional view of an organic electroluminescence module with two light emitting areas of the present invention, illustrating an example configuration (Embodiment 1) thereof.

FIG. 4 is a schematic cross-sectional view of the organic EL module with two light emitting areas that is applicable to Detection Method 1, illustrating the configuration (Embodiment 1) thereof.

The organic EL module (1) in FIG. 4 includes two divided anodes of Anode 1 (4A) and Anode 2 (4B) on a transparent substrate (3) that are separated and aligned with each other to form the two light emitting areas. On the anode portions, the common organic functional layer unit (5), which is constituted by, for example, a hole injection layer, a hole transport layer, a light emitting layer, an electron transport layer, an electron injection layer and the like, is laminated to form the light emitting areas. On the organic functional layer unit (5), the cathode electrode (6, negative electrode), which is shared by the two light emitting areas, is laminated to form the organic EL element. The organic EL element is sealed with the sealing adhesive (7) at the outer periphery thereof, and the sealing member (8) is disposed on the surface thereof in order to prevent harmful gas (oxygen, vapor, etc.) penetrating into the light emitting part from the outer environment. The organic EL panel (2) is thus formed.

The organic EL panel (2) of the present invention may include a metal foil layer on the outermost surface in order to protect the organic EL element.

In the configuration in FIG. 4, the pair of electrodes, the anode portions (4A, 4B) and the cathode electrode (6), is connected to the light emitting element drive circuit unit (12) for controlling light emission.

In FIG. 4, the pair of electrodes, the anode portions (4A, 4B) and the cathode electrode (6), has a function as touch detection electrodes, and the pair of electrodes, the anode portions (4A, 4B) and the cathode electrode (6), is connected to the touch detection circuit unit (14) for detecting contact (touch) or proximity (hovering) of the finger (15).

Schematic Configuration of Organic EL Module Applicable to Detection Method 2: Embodiment 2

Figure 5:
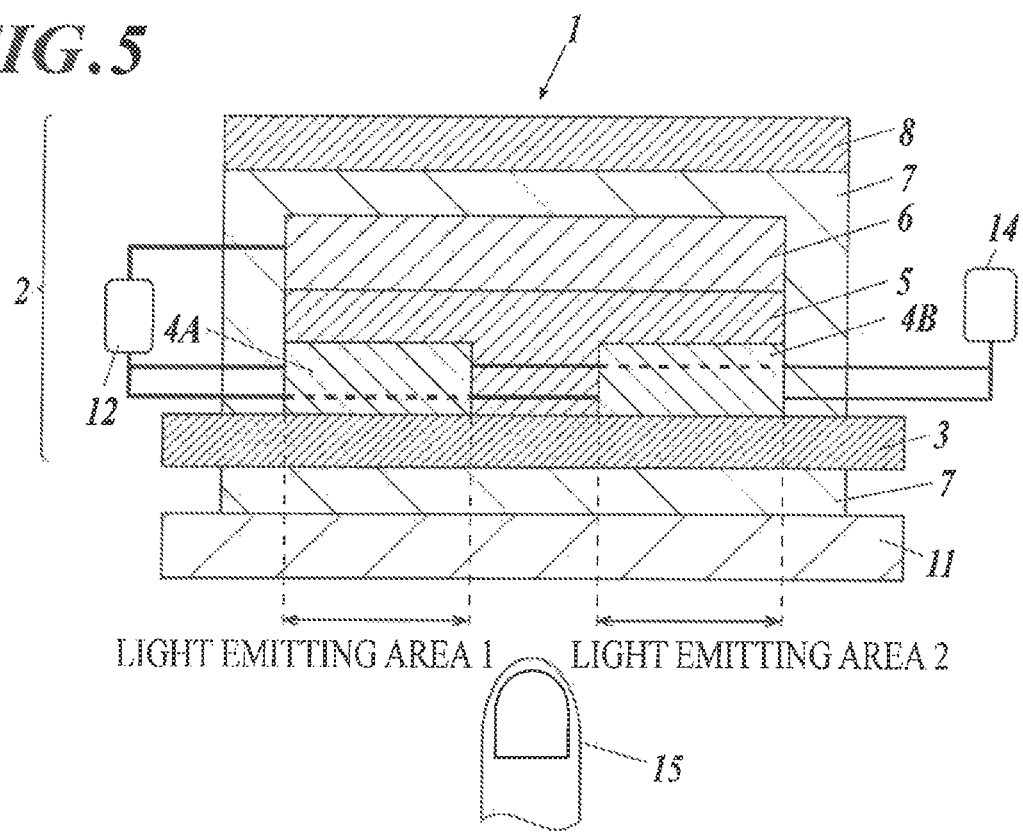
FIG. 5 is a schematic cross-sectional view of the organic electroluminescence module with two light emitting areas of the present invention, illustrating an example configuration (Embodiment 2, floating cathode electrode) thereof.

FIG. 5 is a schematic cross-sectional view of the organic EL module with two light emitting areas that is applicable to Detection Method 2, illustrating the configuration (Embodiment 2) thereof.

In the organic EL module in FIG. 5, the pair of electrodes, the anode portions (4A, 4B) and the cathode electrode (6), is connected to the light emitting element drive circuit unit (12).

However, the configuration of Embodiment 2 is different from that of Embodiment 1 as describe above with FIG. 4 in that the cathode electrode (6) is floating and not connected to the touch detection circuit unit (14).

Driver Circuit of Organic EL Module

Next, the driver circuit of the organic EL module of the present invention and the driving method thereof will be described.

Representative Driver Circuit Diagram of Embodiment 1

Figure 6:
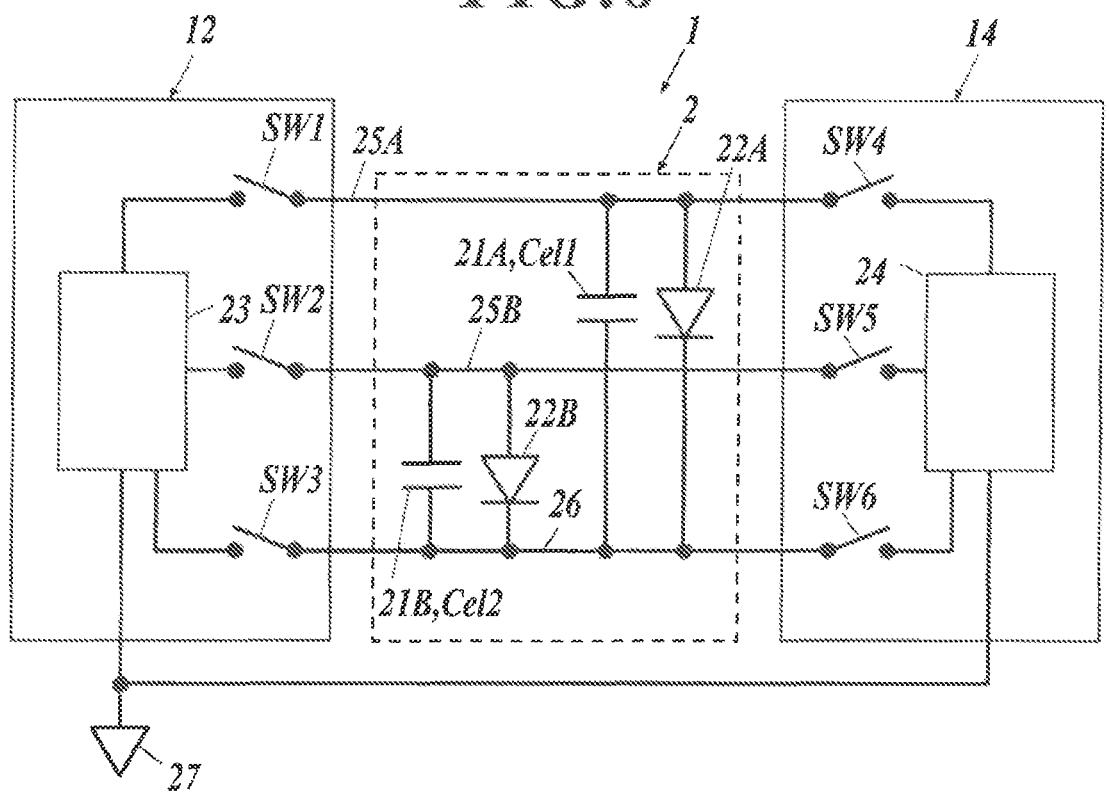
FIG. 6 is a driver circuit diagram of an example of a circuit for driving the organic electroluminescence module according to Embodiment 1 (single ground).

FIG. 6 is a driver circuit diagram of an example configuration of the circuit for driving the organic EL module in FIG. 4 according to Embodiment 1.

In the circuit diagram of the organic EL module (1) in FIG. 6, the organic EL panel (2) enclosed in the dashed line at the center includes as a first organic EL unit an anode electrode wiring (25A) of the anode (4A), one of the two divided portions, and a cathode electrode wiring (26) of the common cathode (6). Between the wirings, the organic EL element (22A), which is a diode, and a capacitor (21A, Cel1) are connected. Further, the organic EL panel (2) includes as a second organic EL unit an anode electrode wiring (25B) of the anode (4B), the other of the divided two portions, and a cathode electrode wiring (26) of the common cathode (6). Between the wirings, the organic EL element (22B), which is a diode, and a capacitor (21B, Cel2) are connected.

In the left light emitting element drive circuit unit (12), the anode electrode wiring (25A) from the anode (4A) of the first organic EL unit is connected to the light emitting element drive circuit section (23) via Switch 1 (SW1), and the anode electrode wiring (25B) from the anode (4B) of the second organic EL unit is connected to the light emitting element drive circuit section (23) via Switch 2 (SW2).

Further, the cathode electrode wiring (26) from the cathode (6) is connected to the light emitting element drive circuit section (23) via Switch 3 (SW3). The light emitting element drive circuit section (23) is connected to the ground (27). In more detail, the ground (27) is referred to as the signal ground.

Light Emitting Element Drive Circuit Unit

In the light emitting element drive circuit unit (12), a constant current driver circuit or a constant voltage driver circuit is incorporated. The light emitting element drive circuit (12) includes the light emitting element drive circuit section (23) that controls the timing of light emission of the organic EL element and can apply a reverse bias (reverse voltage) according to need. In FIG. 6, the light emitting element drive circuit section (23) is independent from SW1 to SW3. However, Switch 1 (SW1), Switch 2 (SW2) and Switch 3 (SW3) may be incorporated in the light emitting element drive circuit section (23) according to need.

As used herein, the light emitting element drive circuit unit (12) refers to a portion of a circuit that is constituted by the anode electrode wirings (25A and 25B), SW1, SW2, the light emitting element drive circuit section (23), SW3 and the cathode electrode wiring (26), which is illustrated by the solid line in FIG. 6.

The configuration of the light emitting element drive circuit section (23) of the present invention is not particularly limited, and a variety of light emitting element drive circuit sections (organic EL element driver circuits) known in the art are applicable. Typically, the light emitting element drive circuit has a function of directing an electric current corresponding to the light emission intensity of the organic EL elements, which are light emitting elements of the two light emitting areas, between the anodes and the cathode, for example, according to a predetermined light emitting pattern of the light emitting elements as illustrated in FIG. 6. An example of such a lighting element driver circuit known in the art is a constant current circuit that is constituted by a step-up or step-down DC-DC converter circuit, a current feedback circuit, a switching control circuit for the DC-DC converter and the like. A reference can be made to the light emitting element drive circuits described in JP 2002-156944A, JP 2005-265937A, JP 2010-040246A and the like.

In the following, the specific configuration of the light emitting element drive circuit section will be described with FIG. 7.

Figure 7:
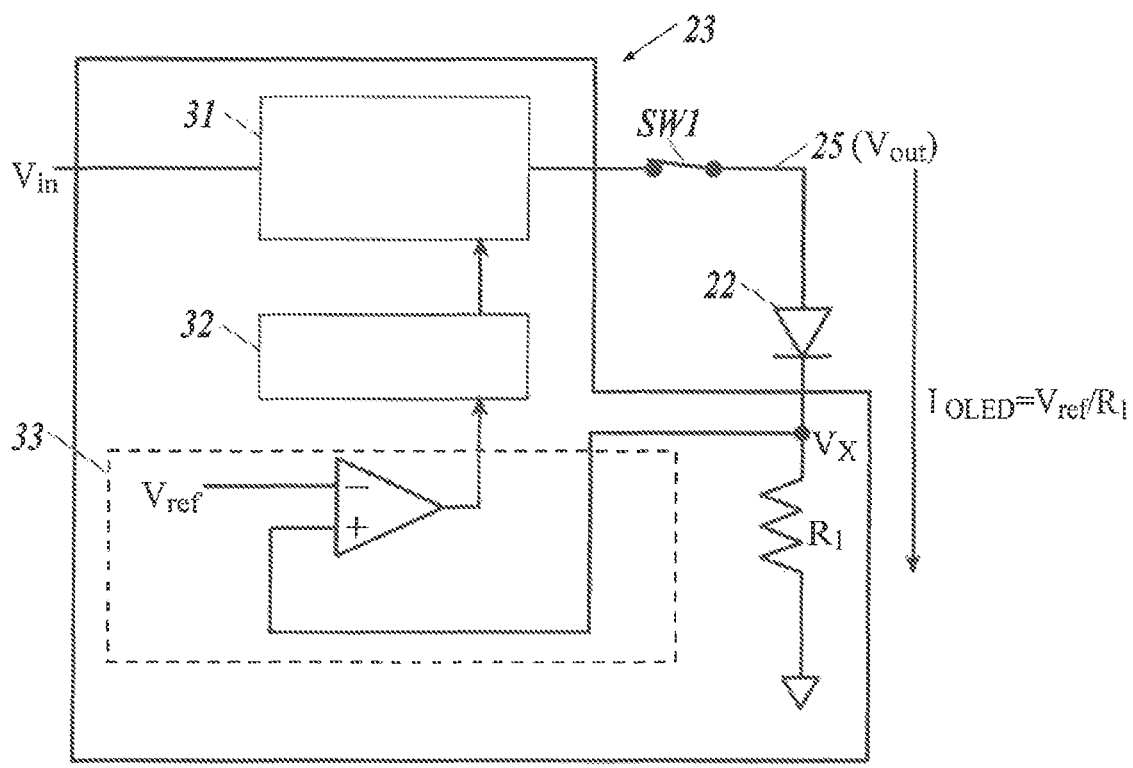
FIG. 7 is a schematic circuit diagram of a light emitting element drive circuit unit of the present invention, illustrating an example configuration thereof.

FIG. 7 is a schematic circuit diagram of the light emitting element drive circuit unit applicable to the present invention, illustrating an example of the configuration thereof.

As illustrated in FIG. 7, the light emitting element drive circuit section (23) includes a step-up or step-down DC-DC converter circuit (31), a switching element control circuit (32) for the DC-DC converter and a current feedback circuit (33). For example, the constant current circuit is configured to increase or decrease the anode potential of the organic EL element (22) with the DC-DC converter circuit (31) so that the current $I_{OLED}$ through the organic EL element 22, which is a diode, becomes $V_{ref}/R_1$, where $R_1$ is the detected resistance, and $V_{ref}$ is the reference potential. The feedback circuit (33) controls the output $V_{out}$ of the DC-DC converter circuit (31) by feedback so that $V_X = V_{ref}$. For example, assuming that $V_{ref} = 0.19$ V and $R_1 = 100\Omega$, the DC-DC converter circuit (31) regulates $V_{out}$ so that the constant current becomes $V_{ref}/R_1 = 1.9$ mA.

Touch Detection Circuit Unit

As used herein, the touch detection circuit unit (14) refers to a part of a circuit that is constituted by the anode electrode wirings (25A and 25B), SW4, SW5, the touch detection circuit section (24), SW6 and the cathode electrode wiring (26), which is illustrated by the solid line in the right side of FIG. 6.

In the touch detection circuit unit (14), the anode electrode wirings (25A and 25B) from the anode electrodes as touch detection electrodes are connected to the touch detection circuit section (24) via Switch 4 (SW4) and Switch 5 (SW5). In Embodiment 1, the cathode electrode wiring (26) of the common cathode (6) is not floating but is connected to the touch detection circuit section (24) via Switch 6 (SW6).

The touch detection circuit section (24) is connected to the ground (27). Switch 4 (SW4), Switch 5 (SW5) and Switch 6 (SW6) may be incorporated in the touch detection circuit section (24).

Contact (Touch)-Based Circuit

The configuration of the contact-based touch detection circuit section (24) is not particularly limited, and conventional touch detection circuit sections known in the art are applicable. The touch detection circuit is typically constituted by an amplifier, a filter, an AD converter, a rectifier and smoother circuit, a comparator and the like. Representative examples of such touch detection circuits include ones of self-capacitance type, series capacitance voltage-dividing comparison type (Omron type). Reference can be made to the touch detection circuits described in JP 2009-543246A, JP 2010-231565A, JP 2012-073783A, JP 2013-088932A, JP 2013-80290A, JP 2014-053000A, JP 2014-99189A, JP 2014-132441A, JP 2014-157402A, JP 2014-229302A and the like.

Switch 1 and Switch 3 (SW1 and SW3) are not particularly limited and may be constituted by any switch having a switching function such as an FET (field-effect transistor) or a TFT (thin-film transistor).

Proximity (Hovering)-Based Circuit

The organic EL module of the present invention is adaptable to a hovering detecting (proximity detecting) technique.

Hovering detection, which is also referred to as proximity detection or three-dimensional touch panel detection, is a technique that enables obtaining coordinate information of a finger even when the finger is not in contact with a touch panel or the like but in a hovering state (proximity state).

Such methods of obtaining the positional information (proximity positional information) of a hovering finger include:

(1) an ultrasonic sensor technique that involves emitting an ultrasonic wave to the finger and measuring the coordinate of the finger in proximity based on the reflection wave thereof;

(2) an optical sensor-based in-cell touch panel for measuring the coordinate of the finger in proximity based on the light intensity received by optical sensors disposed in cells of a display; and (3) a capacitance touch panel for measuring the coordinate of the finger in proximity based on a change of the capacitance on a touch panel.

In the present invention, hovering detection (proximity detection) is based on (3) the capacitance technique. This is because the proximity positional information can be obtained over the entire surface of a touch panel, the proximity positional information can always be obtained by a stable operation, no additional new device is required, and the like.

Next, an example of the capacitance-based hovering detection (proximity detection) will be described.

The capacitance-based hovering detection is a technique of detecting proximity of a finger to a touch panel based on the capacitance between one electrode (e.g. anode) of a touch panel and the other electrode (e.g. cathode) or the ground.

When a touch gesture is detected based on the capacitance technique, the touch detection circuit measures the capacitance between a finger and the touch detection electrode to detect a contact. Since the finger is electrically conductive, a capacitance is produced between the finger and the touch detection electrode (including a cover glass). Generally, the capacitance C (F) produced between parallel two conductive plate is represented by the following equation (1), where S ($m^2$) is the area of the two parallel conductive plates, D (m) is the distance between the two conductive plates, and ε is the permittivity of a dielectric filled between the two conductive plates.

$$C=(\varepsilon \times S)/D \qquad \text{Equation (1):}$$

As seen from Equation (1), the produced capacitance C increases as the distance D between the two conductive plates decreases, and the produced capacitance C decreases as the distance D between the two conductive plates increases. Accordingly, the capacitance C increases as the distance D between the finger and the hovering detection electrode decreases.

The hovering detector circuit section (24) measures the produced capacitance C. When the finger approaches as close as possible to the hovering detection electrode so that the distance D becomes almost 0, the measured capacitance C becomes equal to or greater than a predetermined threshold Cth1 (contact threshold Cth1). In this state, the hovering detector circuit section determines that the finger is so close (contact) that the finger can be considered to be in contact with the hovering detection electrode via the cover glass. Further, the hovering detection electrode determines a contact point, which is the point where the detected capacitance is equal to or greater the contact threshold Cth1, and outputs the coordinate information thereof to the hovering detector circuit unit.

Even when a user wears a glove or the finger is hovering, the capacitance is produced as represented by Equation (1) although the finger is not in contact with the hovering detection electrode via the cover glass. By decreasing the contact threshold Cth1, it becomes possible to sense proximity of the finger even when the finger is hovering, i.e. in contact with the hovering detection electrode via the cover glass. In this way, even when the finger is not in contact, the hovering detector circuit section (24) can detect the finger in proximity that is apart from the hovering detection electrode at a certain distance. This function of detecting proximity of a finger even when it is not in contact with the cover glass of the hovering detection electrode is referred to as a hovering function.

For the hovering function, the threshold of the capacitance that is produced when the finger approaches at "the certain distance" can be predetermined as Cth2 (<Cth1). That is, when the measured capacitance (C) is less than the contact threshold Cth1 but equal to or greater than the proximity threshold Cth2, the finger (15) is not in contact with the hovering detection electrode via the cover glass but is in proximity to it at a certain distance. The hovering detector can determine that the finger is not in contact with the hovering detection electrode via the cover glass but is in certain proximity to it.

The specific controlling method for the hovering detection can be suitably selected, for example, from the methods described in JP 2009-543246A, JP 2010-231565A, JP 2013-80290A, JP 2014-99189A, JP 2014-132441A, JP 2014-157402A, JP 2014-229302A and the like.

Driving Method 1 in Embodiment 1

Figure 8:
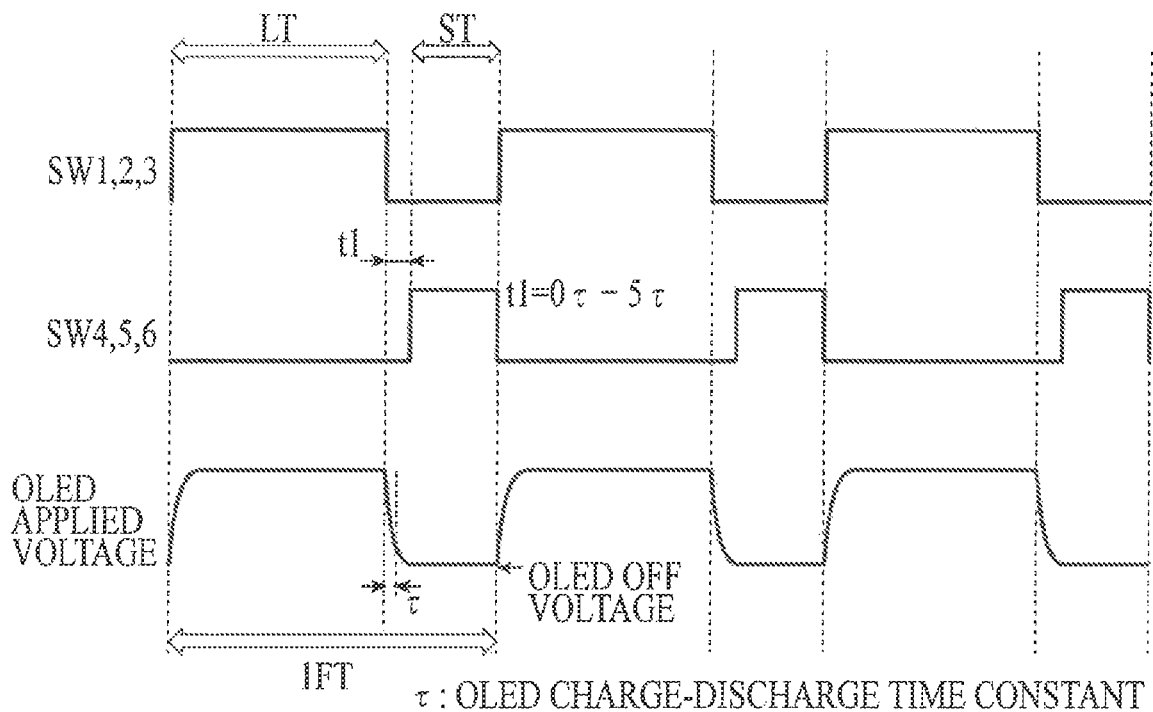
FIG. 8 is a timing chart of an example of light emission periods and touch detection periods of the driver circuit (Embodiment 1) in FIG. 6.

FIG. 8 illustrates a timing chart of an example of the light emission periods and the touch detection periods in Embodiment 1.

The organic EL module (1) of Embodiment 1, having the circuit configuration as illustrated in FIG. 6, controls ON/OFF of the switches to separate the operation into the light emission periods of the organic EL panel under control of the light emitting element drive circuit unit (12) and the touch detection periods under control of the touch detection circuit unit (14) so as to impart the touch sensor function to the light emitting display area.

The upper graph in FIG. 8 represents the ON/OFF timing of SW1 to SW3 of the light emitting element drive circuit unit (12), and the graph therebelow similarly represents the operation timing of SW4 to SW6 of the touch detection circuit unit (14). High periods in the graphs correspond to the ON state of the switches. The same applies to the following timing charts.

The lowermost graph represents the history of a voltage applied to the two organic EL elements (OLED). When SW1 to SW3 are turned "ON", the voltage applied to the OLEDs is increased from the off voltage, and the OLEDs starts to emit light when the voltage becomes high enough for light emission. Then, when SW1 to SW3 are turned "OFF", current supply to the OLEDs is stopped, and the OLEDs are turned off. However, when SW1 to SW3 are turned "OFF", the OLEDs are not turned off immediately, but it takes a certain time before they are turned off according to the charge-discharge time constant τ of the OLEDs.

The SW4 to SW6 are provided to control the operation of the touch detection circuit unit (14). When SW1 to SW3 are "ON", SW4 to SW6 are "OFF". After SW1 to SW3 are turned "OFF" SW4 to SW6 are turned "ON" so that a touch gesture is detected. With regard to the timing of turning "ON" SW4 to SW6, they are turned "ON" a predetermined waiting time t after the above-described SW1 to SW3 are turned "OFF". The waiting time t is preferably within the range of 0τ to 5τ, where τ is the charge-discharge time constant of the OLEDs.

In the timing chart in FIG. 8, a light emission period (LT) corresponds to a period from turning "ON" SW1 to SW3 to turning them "OFF", and a touch detection period (ST) corresponds to a period from turning "ON" SW4 to SW6, which is the waiting time t after turning "OFF" SW1 to SW3, to turning "OFF" SW4 to SW6 after touch detection. An LT+ST refers to as a unit frame period (1 FT).

The light emission period (LT), the touch detection period (ST) and the unit frame period (1 FT) of the organic EL module of the present invention are not particularly limited, and any condition suitable for the use environment is suitably selected. For example, it is preferred that the light emission period (LT) of the OLEDs is within the range of 0.1 msec to 2.0 msec, the touch detection period (ST) is within the range of 0.05 msec to 0.3 msec, and the unit frame period (1 FT) is within the range of 0.15 msec to 2.3 msec. The unit frame period (1 FT) is preferably equal to or greater than 60 Hz in terms of reducing a flicker.

Driving Method 2 in Embodiment 1

Figure 9:
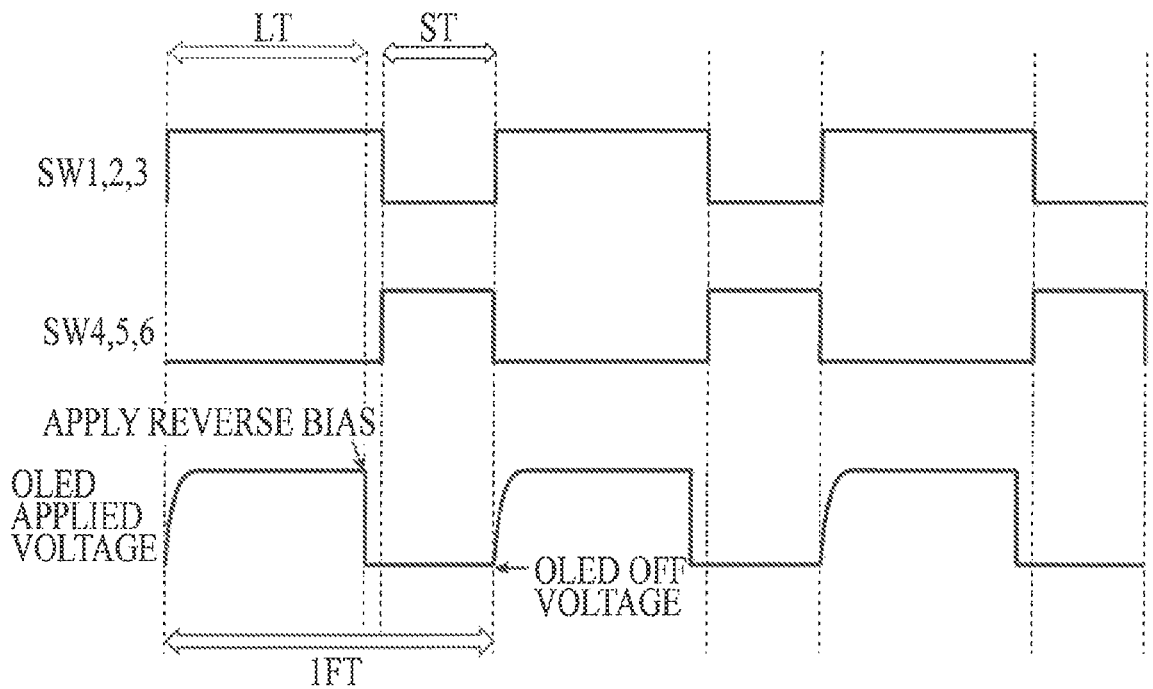
FIG. 9 is a timing chart of another example (reverse voltage being applied) of the light emission periods and the touch detection periods of the driver circuit (Embodiment 1) in FIG. 6.

FIG. 9 is a timing chart of another example (a reverse bias voltage being applied to the OLEDs) of the light emission periods and the touch detection periods of the driver circuit (Embodiment 1) in FIG. 6.

Compared to the voltage pattern applied to the OLEDs in FIG. 8, the timing chart in FIG. 9 is controlled such that the reverse voltage (reverse bias voltage) is applied between the anodes and the cathode after turning "ON" SW1 to SW3 immediately before turning "OFF" at the end of the light emission period (LT) so that charging or discharging is reduced while the OLEDs are off. It is not necessary to provide the waiting time t as illustrated in FIG. 8 in the pattern of SW4 to SW6.

Circuit Operation in Light Emission Periods in Embodiment 1

Figure 10:
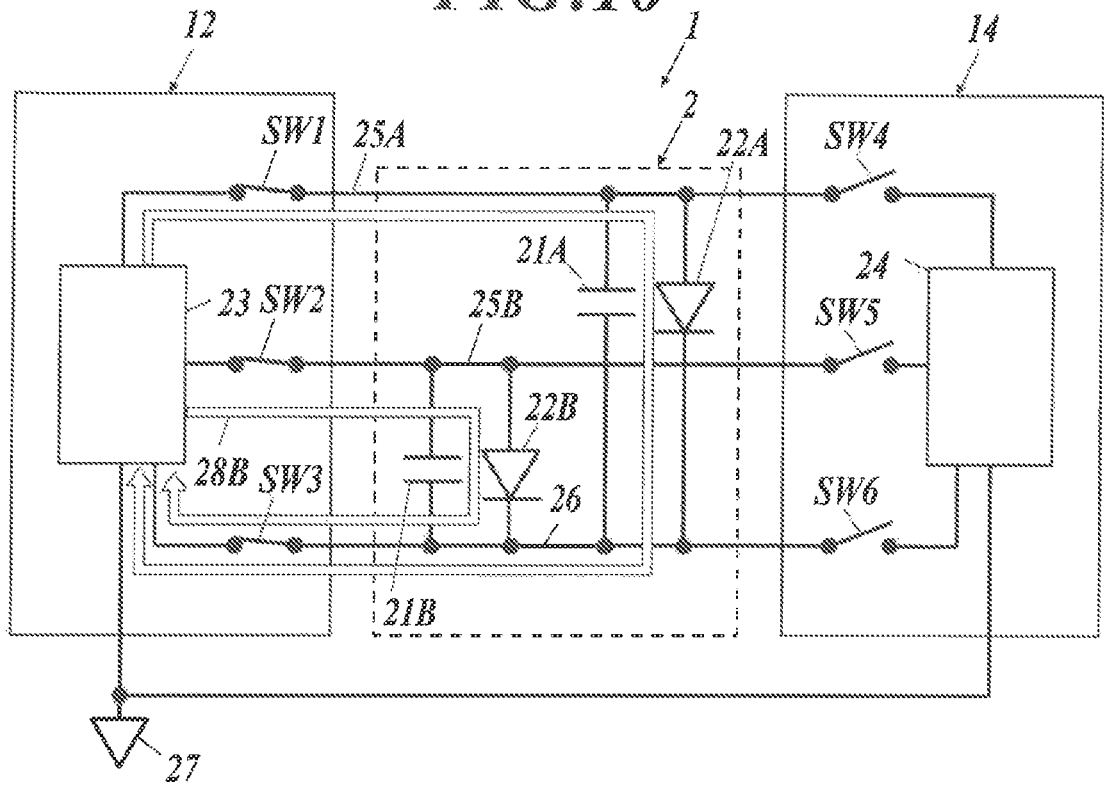
FIG. 10 is a circuit operation diagram of an example of the circuit operation in the light emission periods in Embodiment 1.

FIG. 10 is a circuit operation diagram illustrating an example of the circuit operation in the light emission periods (LT) in Embodiment 1.

In the light emission periods (LT) in Embodiment 1, SW1 to SW3 are "ON", and the light emitting element drive circuit section (23) controls the light emitting conditions so that the two organic EL elements (22A and 22B) emit light in two light emission control information routes for the two organic EL units (28A and 28B).

In the periods, SW4 to SW6 of the touch detection circuit unit (14) are "OFF".

Circuit Operation During Touch Detection Periods in Embodiment 1

Figure 11:
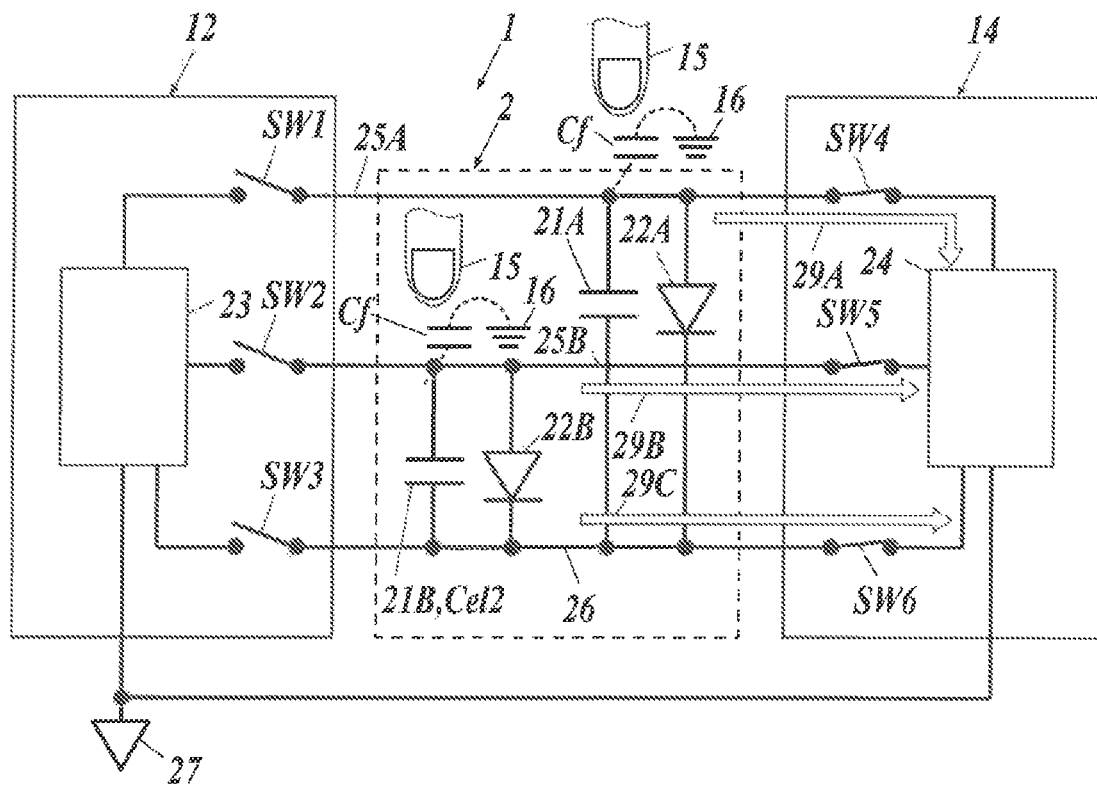
FIG. 11 is a circuit operation diagram of an example of the circuit operation in the touch detection periods in Embodiment 1.

FIG. 11 is a circuit operation diagram illustrating an example of the circuit operation in the touch detection periods (ST) in Embodiment 1.

In FIG. 11, SW1 to SW3 of the light emitting element drive circuit unit (12) are "OFF" so that the light emitting element drive circuit is released, and the Switch 4 (SW4) to Switch 6 (SW6) of the touch detection circuit unit (14) are "ON". When the finger (15) touches the upper surface of the glass substrate of the anode electrode wirings (25A and 25B), which includes anodes (4A and 4B) as detection electrodes of the organic EL panel (2), the capacitance Cf is produced between the finger (15) and the anode electrodes (4A and 4B) as the detection electrodes. The capacitance Cf is connected to the earth (grounded). 29A to 29C are touch detection information routes in sensing.

Representative Driver Circuit Diagram in Embodiment 2

Figure 12:
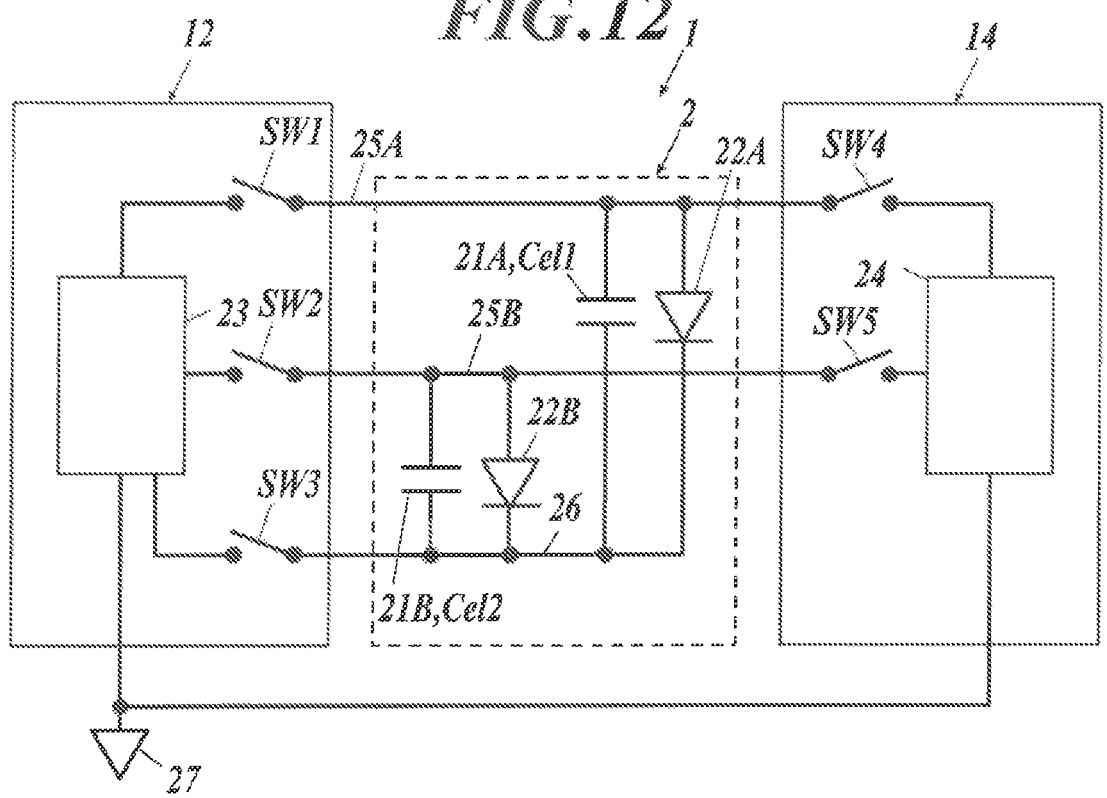
FIG. 12 is a driver circuit diagram of an example of a circuit for driving an organic electroluminescence module according to Embodiment 2 (floating cathode electrode).

FIG. 12 is a driver circuit diagram illustrating an example of the circuit configuration of Embodiment 2, in which the cathode (6) as illustrated in FIG. 3 and FIG. 5 is floating.

In the circuit diagram of the organic EL module (1) in FIG. 12, the anode electrode wiring (25A) of the anode (4A), one of the divided two anodes, and the cathode electrode wiring (26) of the common cathode (6) are included as the first organic EL unit as with the circuit diagram of the previously-described Embodiment 1 in FIG. 6. Between the wirings, the organic EL element (22A), which is a diode, and the capacitor (21A, Cel1) are connected. Further, the anode electrode wiring (25B) of the anode (4B), the other of the divided two diodes, and the cathode electrode wiring (26) of the common cathode (6) are included as a second organic EL unit. Between the wirings, the organic EL element (22B), which is a diode, and the capacitor (21B, Cel2) are connected.

In the left light emitting element drive circuit unit (12), the anode electrode wiring (25A) from the anode (4A) of the first organic EL unit is connected to the light emitting element drive circuit section (23) via Switch 1 (SW1), and the anode electrode wiring (25B) from the anode (4B) of the second organic EL unit is connected to the light emitting element drive circuit section (23) via Switch 2 (SW2).

Further, the cathode electrode wiring (26) from the cathode (6) is connected to the light emitting element drive circuit section (23) via Switch 3 (SW3). The light emitting element drive circuit section (23) is connected to the ground (27).

In the touch detection circuit unit (14), the anode electrode wirings (25A and 25B) from the anode electrodes, which function as touch detection electrodes as in Embodiment 1, are connected to the touch detection circuit section (24) via Switch 4 (SW4) and Switch 5 (SW5). However, a feature of Embodiment 2 is that the cathode electrode wiring (26) of the common cathode (6) is floating and not connected to the touch detection circuit section (24).

The configuration of Embodiment 2 also enables multi-touch according to the principle as described with FIG. 3.

Driving Method 1 and Driving Method 2 in Embodiment 2

Figure 13:
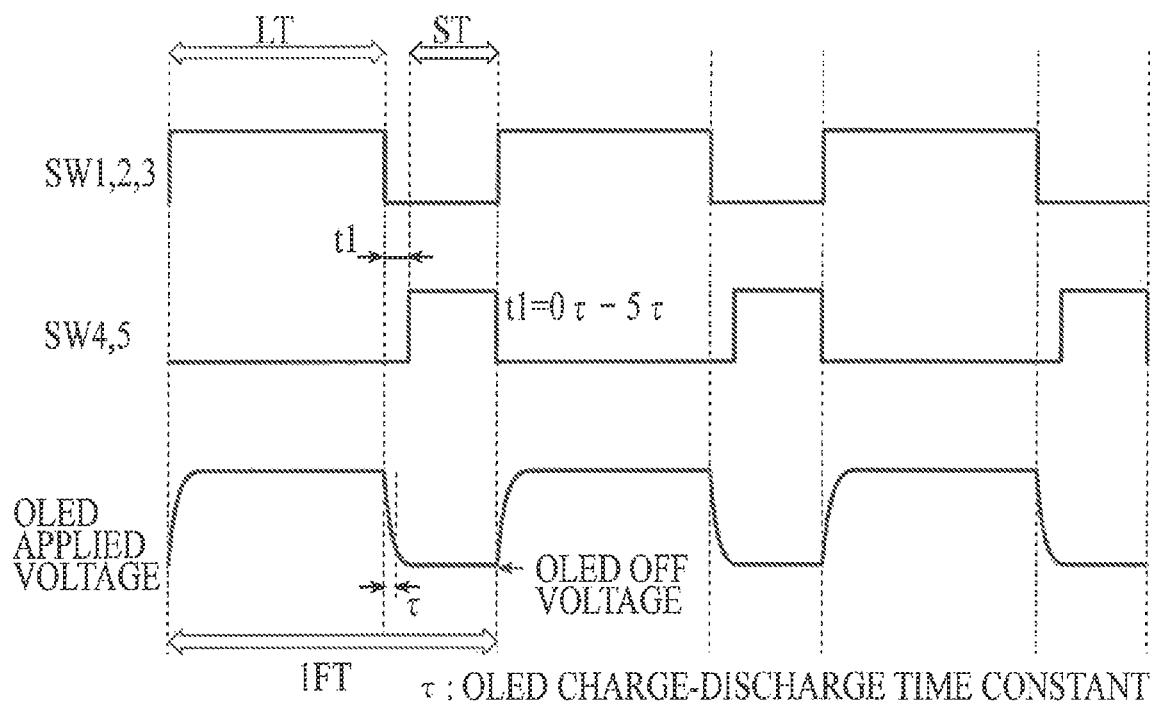
FIG. 13 is a timing chart of an example of light emission periods and touch detection periods of the driver circuit (Embodiment 2) in FIG. 12.
Figure 14:
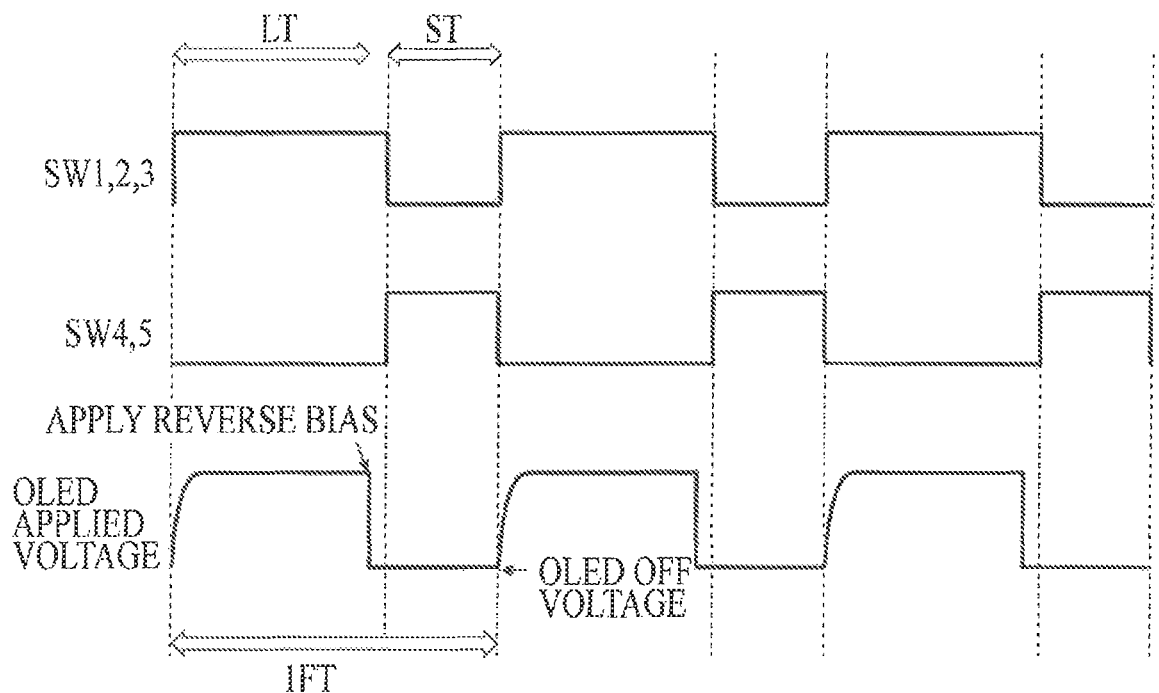
FIG. 14 is a timing chart of another example (reverse voltage being applied) of the light emission periods and the touch detection periods of the driver circuit (Embodiment 2) in FIG. 12.

FIG. 13 is a timing chart illustrating an example of the light emission periods and the touch detection periods in the driver circuit (Embodiment 2) in FIG. 12, and FIG. 14 is a timing chart illustrating another example (the reverse voltage being applied) of the light emission periods and the touch detection periods in the operation circuit (Embodiment 2) in FIG. 12.

The timing charts are the same as the timing charts of FIG. 8 and FIG. 9 of the previously-described Embodiment 1 except that the switches in the touch detecting part are constituted by SW4 and SW5, and the detailed description thereof is omitted.

Circuit Diagram of Other Organic EL Modules

Embodiment 3: Independent Grounds are Disposed in Respective Circuit Units

Figure 15:
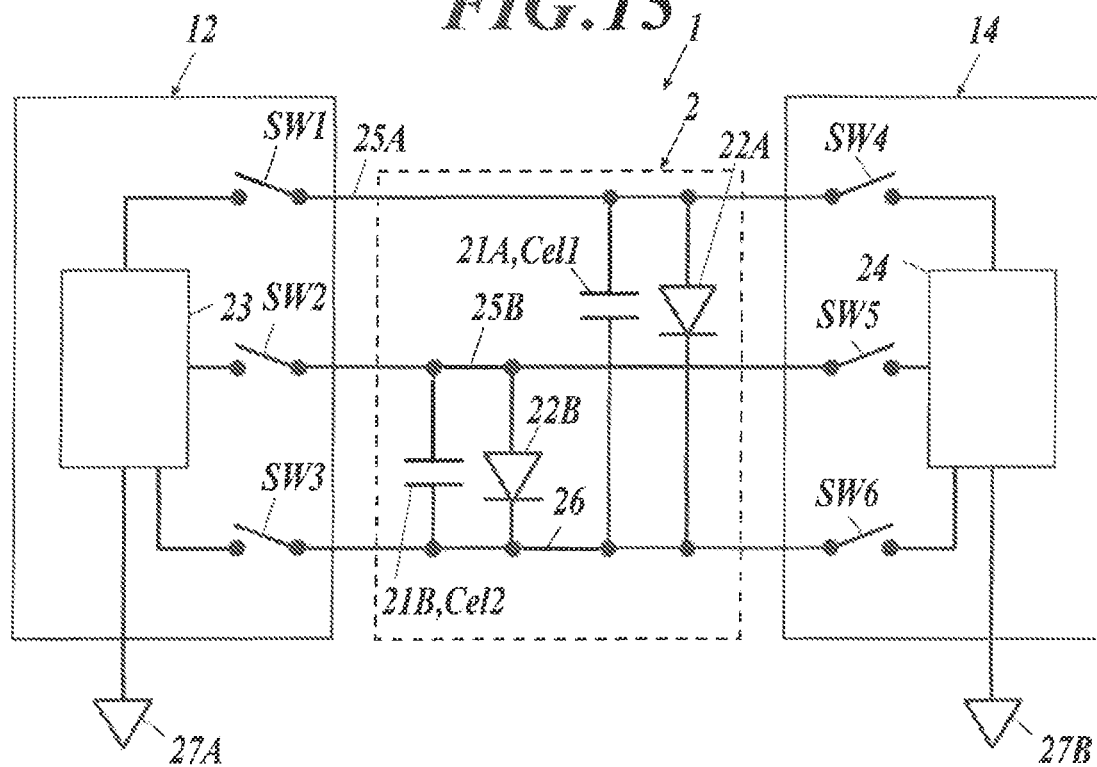
FIG. 15 is a driver circuit diagram of an example of a circuit for driving an organic electroluminescence module according to Embodiment 3 (two grounds).

FIG. 15 is a driver circuit diagram of an example of the organic EL module in Embodiment 3, in which the touch detection circuit unit and the light emitting element drive circuit unit are independently grounded.

In the circuit diagram of the organic EL module (1) in FIG. 15, an organic EL panel (2) with organic EL units illustrated at the center, a light emitting element drive circuit unit (12) and a touch detection circuit unit (14) have the same configuration as those of Embodiment 1 as described above with FIG. 6.

In Embodiment 3, the light emitting element drive circuit unit (12) is connected to an independent ground (27A), and the touch detection circuit unit (14) also has an independent ground (27B).

Embodiment 4: Using Capacitor Instead of SW3

Figure 16:
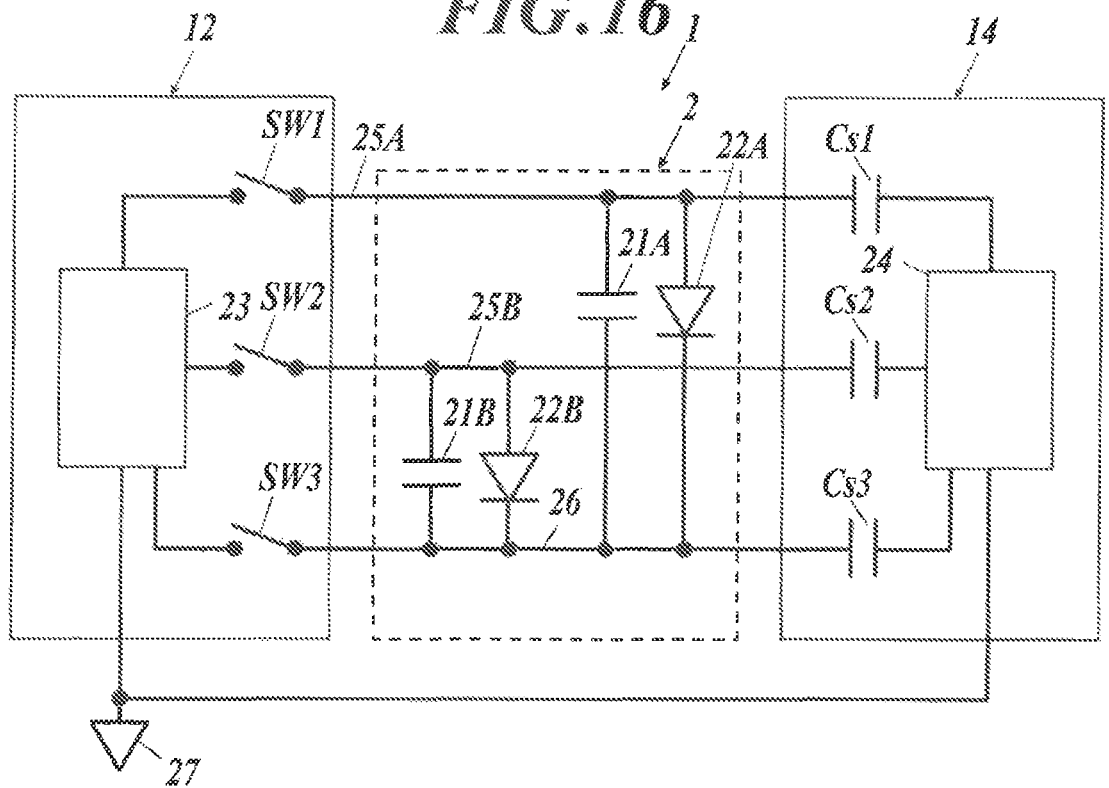
FIG. 16 is a circuit operation diagram of an example of the circuit operation in touch detection periods in Embodiment 4 (switches being changed to capacitors).

Compared to the driver circuit of Embodiment 1 as illustrated in FIG. 6, Switch 4 (SW4) to Switch 6 (SW6) of the touch detection circuit unit (14) are changed respectively to capacitors Cs1 to Cs3 in Embodiment 4 in FIG. 16. The capacitors Cs1 to Cs3 incorporated in the circuit have the same function as Switch 4 to Switch 6.

Switch 1 (SW1) to Switch 3 (SW3) may be incorporated in a light emitting element drive circuit section (23). Further, the capacitors Cs1 to Cs3 may be incorporated in the touch detection circuit section (24).

Embodiment 5

Figure 17:
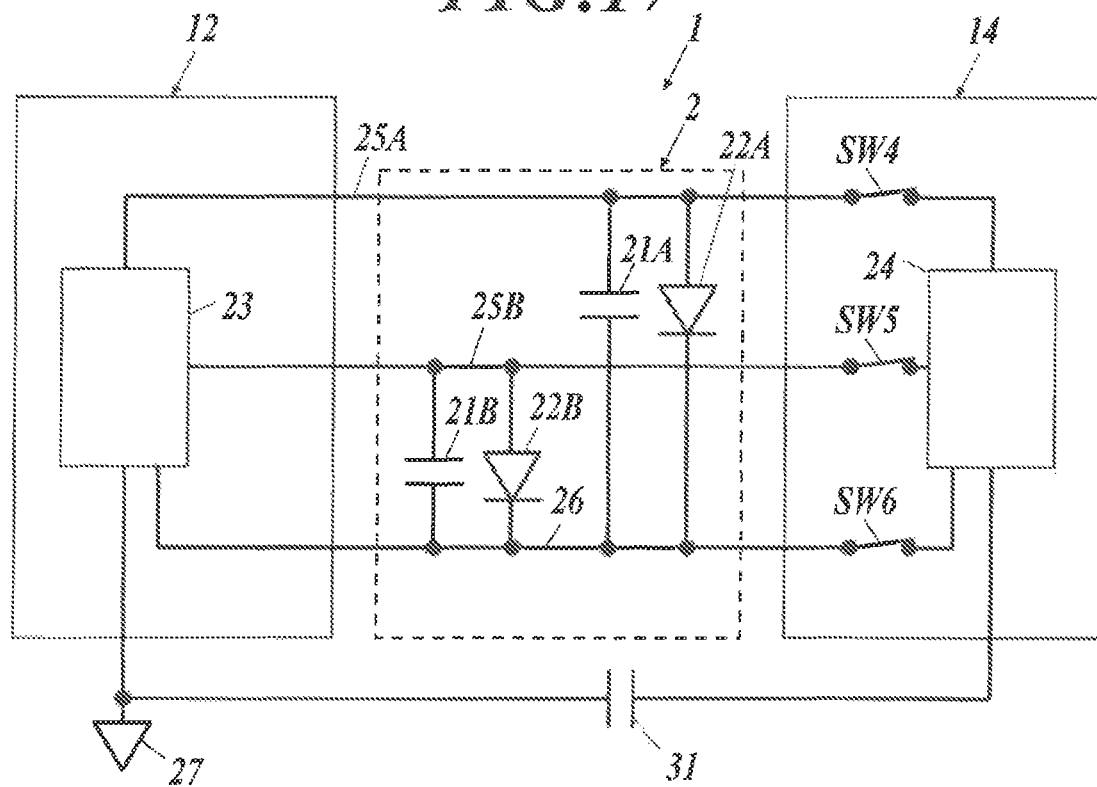
FIG. 17 is a circuit operation diagram of an example of the circuit operation in the touch detection periods of an organic electroluminescence module according to Embodiment 5 (continuous light emission).

In Embodiment 5, an organic EL module includes a single ground, and OLEDs always emit light. FIG. 17 is a circuit operation diagram illustrating an example of the circuit operation in a touch detection period.

The circuit diagram of the organic EL module (Embodiment 5) in FIG. 17 is an example in which the organic EL module is driven such that two organic EL elements (22A and 22B) of an organic EL panel are controlled by a light emitting element drive circuit section (23) to continuously emit light while touch detection periods controlled by a touch detection circuit section (24) periodically appear. Specifically, a capacitor (31) is provided in the wiring that connects the light emitting element drive circuit section (23) and the ground of the touch detection circuit section (24).

In FIG. 17, since there is no switch in the part including the light emitting element drive circuit unit (12), the circuit is always on. Accordingly, the organic EL elements (22) continuously emit light. In contrast, in the touch detection circuit unit (14) at the right side, anode electrode wirings (25) form anode electrodes, which function as touch detection electrodes, are connected to the touch detection circuit section (24) via Switch 3 (SW3), and the touch detection circuit section is connected to the ground (27) via the capacitor (31).

In FIG. 17, SW4 to SW6 of the touch detection circuit unit (14) are "ON". When the finger (15) touches the upper surface of a glass substrate of the anode electrode wirings (25A and 25B), which includes anode electrodes (4) as detection electrodes of the organic EL panel (2), the capacitance Cf is produced between the finger (15) and the anode electrodes (4A and 4B) as the detection electrodes. The touch gesture can thus be detected.

Figure 18:
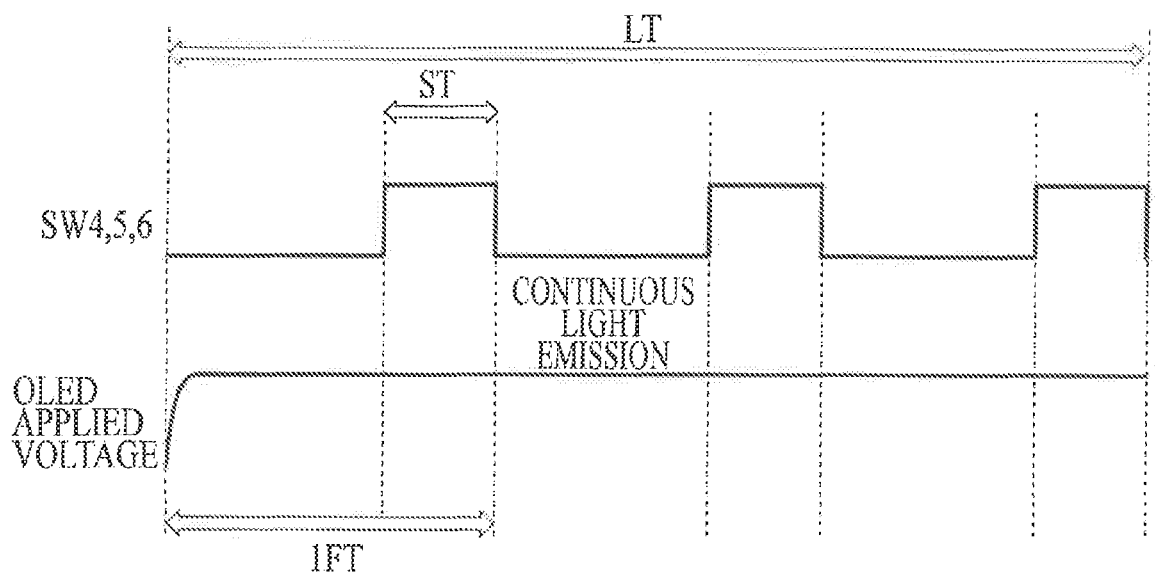
FIG. 18 is a timing chart composed of a continuous light emission period and intermittent touch detection periods according to Embodiment 5.

FIG. 18 is a timing chart in Embodiment 5, which is composed of a continuous light emission period (ST) and intermittent touch detection periods (ST). SW1 to SW3 as illustrated in FIG. 8 are not present, and the driver circuit for the two organic EL elements are always connected. Accordingly, the voltage applied to the two organic EL elements is always "ON", and the two organic EL elements always emit light. In contrast, by switching the SW4 to SW6 of the touch detection circuit unit (14) between "ON/OFF", it is possible to periodically detect a touch gesture (ST).

Configuration of Organic Electroluminescence Panel

A representative example of the organic EL panel (2) of the organic EL module (1) is as follows. As illustrated in FIG. 4, the divided anode electrodes (4A and 4B, positive electrodes) and the similarly divided organic functional layer units (5A and 5B) are laminated on the transparent substrate (3), and the common cathode electrode (6, negative electrode) is laminated over the organic functional layer unit (5A and 5B) so that the organic EL elements with two light emitting units is formed. The outer periphery of the organic EL elements is sealed with the sealing adhesive (7), and the sealing member (8) is disposed on the surface thereof. The organic EL panel (2) is thus formed.

In the following, a representative example of the configuration of the organic EL elements will be described.

(i) Positive electrode/hole injection and transport layer/light emitting layer/electron injection and transport layer/negative electrode (ii) Positive electrode/hole injection and transport layer/light emitting layer/hole blocking layer/electron injection and transport layer/negative electrode (iii) Positive electrode/hole injection and transport layer/electron blocking layer/light emitting layer/hole blocking layer/electron injection and transport layer/negative electrode (iv) Positive electrode/hole injection layer/hole transport layer/light emitting layer/electron transport layer/electron injection layer/negative electrode (v) Positive electrode/hole injection layer/hole transport layer/light emitting layer/hole blocking layer/electron transport layer/electron injection layer/negative electrode (vi) Positive electrode/hole injection layer/hole transport layer/electron blocking layer/light emitting layer/hole blocking layer/electron transport layer/electron injection layer/negative electrode A non-light emitting intermediate layer may be further intervened in the light emitting layer. The intermediate layer may be constituted by either charge generation layer or multiphoton unit.

Examples of the detailed configuration of organic EL elements that are applicable to the present invention are described in JP 2013-157634A, JP 2013-168552A, JP 2013-177361A, JP 2013-187211A, JP 2013-191644A, JP 2013-191804A, JP 2013-225678A, JP 2013-235994A, JP 2013-243234A, JP 2013-243236A, JP 2013-242366A, JP 2013-243371A, JP 2013-245179A, JP 2014-003249A, JP 2014-003299A, JP 2014-013910A, JP 2014-017493A, JP 2014-017494A and the like.

Next, details of the layers of the organic EL elements of the present invention will be described.

Transparent Substrate

Examples of transparent substrates (3) that are applicable to the organic EL elements of the present invention include transparent materials such as glass and plastic. Preferred transparent transparent substrates (3) include glass, quartz and resin film.

Examples of glass materials include silica glass, soda-lime silica glass, lead glass, borosilicate glass, alkali-free glass and the like. In terms of the adhesion to an adjacent layer, the durability and the smoothness, the surface of the glass materials may be mechanically processed by polishing or the like, or an inorganic or organic coating or a hybrid coating thereof may be formed on the surface of the glass material according to need. Examples of resin materials of resin films include polyesters such as polyethylene terephthalate (abbreviated as PET) and polyethylene naphthalate (abbreviated as PEN), polyethylene, polypropylene, cellulose esters and the derivatives thereof such as cellophane, cellulose diacetate, cellulose triacetate (abbreviated as TAC), cellulose acetate butyrate, cellulose acetate propionate (abbreviated as CAP), cellulose acetate phthalate and cellulose nitrate, polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (abbreviated as PES), polyphenylene sulfide, polysulfones, polyether imide, polyether ketone imide, polyamide, fluororesins, nylon, polymethyl methacrylate, acryls and polyarylates, cycloolefin resins such as ARTON (product name, JSR Corporation), APEL (product name, Mitsui Chemicals, Inc.), and the like.

The organic EL elements further include a gas barrier layer on the above-described transparent substrate (3) according to need.

The gas barrier layer may be made of any material that has a function of preventing penetration of substances that degrade the performance of the organic EL elements, such as water and oxygen. Examples of such materials that can be used include inorganic materials such as silicon oxide, silicon dioxide and silicon nitride, and the like. To improve the brittleness, it is preferred that the gas barrier layer, has a layered structure of such an inorganic layer and an organic layer of an organic material. The arrangement of the inorganic layer and the organic layer is not particularly limited. However, it is preferred to alternately layer them multiple times.

Anode Electrode: Positive Electrode

Examples of the positive electrode of the organic EL elements include metals such as Ag and Au, alloys of such metals, CuI, and metal oxides such as indium-tin complex oxide (ITO), $SnO_2$ and ZnO. Preferred are metals and alloys of such metals. More preferred are silver and silver-based alloys.

When a silver-based transparent positive electrode is used, the purity of silver is preferably equal to or greater than 99%. To stabilize silver, palladium (Pd), copper (Cu), gold (Au) or the like may be added.

While the transparent positive electrode is a silver-based layer, it may be made of either pure silver or a silver (Ag)-based alloy. Examples of such alloys include silver-magnesium (Ag—Mg), silver-copper (Ag—Cu), silver-palladium (Ag—Pd), silver-palladium-copper (Ag—Pd—Cu), silver-indium (Ag—In) and the like.

Of the above-described materials of the positive electrode, it is preferred that the positive electrode of the organic EL elements of the present invention is a silver-based electrode and has a thickness within the range of 2 nm to 20 nm, more preferably within the range of 4 nm to 12 nm. It is preferred that the thickness is equal to or less than 20 nm, since absorption and reflection at the transparent positive electrode is reduced to a low level, and the high optical transmittance is achieved.

As used herein, a silver-based layer means that the silver content in the transparent positive electrode is equal to or greater than 60 wt %, preferably equal to or greater than 80 wt %, more preferably equal to or greater than 90 wt %, particularly preferably equal to or greater than 98 wt %. As used herein, the transparent positive electrode being "transparent" means that the optical transmittance at a wavelength of 550 nm is equal to or greater than 50%.

The silver-based layer of the transparent positive electrode may be constituted by a plurality of layers according to need.

In the present invention, when the positive electrode is constituted by a silver-based transparent positive electrode, it is preferred to provide a base layer under the positive electrode in order to improve the uniformity of the silver film of the transparent positive electrode to be formed. The base layer is not particularly limited, but it preferably contains an organic compound containing a nitrogen atom or a sulfur atom. In a preferred embodiment, the transparent positive electrode is formed on such a base layer.

Intermediate Electrode

The organic EL elements of the present invention may include laminated two or more organic functional layer units, each composed of an organic functional layer and a light emitting layer, between the positive electrode and the negative electrode. Between the two or more organic functional layer units, an intermediate electrode layer unit including an independent connector terminal for electric connection may be provided to separate them.

Light Emitting Layer

It is preferred that the light emitting layer of the organic EL elements contains a phosphorescent compound as a light emitting material.

The light emitting layer emits light when electrons injected from the electrode or the electron transport layer are re-combined with holes injected from the hole transport layer. The light emitting site may be either inside the light emitting layer or at the boundary to an adjacent layer.

The configuration of the light emitting layer is not particularly limited, and it is only necessary that the light emitting material satisfies the light emitting conditions.

Further, the light emitting layer may include a plurality of layers having the same light emitting spectrum or maximum light emission wavelength. In this case, it is preferred to provide a non-light emitting intermediate layer between the light emitting layers.

The total thickness of the light emitting layer is preferably within the range of approximately 1 nm to 100 nm. The thickness is more preferably within the range of 1 nm to 30 nm since the layer can emit light at a lower driving voltage. When a non-light emitting intermediate layer is provided between the light emitting layers, the total thickness of the light emitting layer includes the thickness of the intermediate layer.

The light emitting layer as described above can be formed from the light emitting material and the host compound described below, for example, by a method known in the art such as vacuum deposition, spin coating, casting, the LB method (Langmuir-Blodgett method) or ink-jetting.

The light emitting layer may contain a mixture of light emitting materials. For example, a phosphorescence material and a fluorescence material (also referred to as a fluorescent dopant or a fluorescent compound) may be mixed in the same light emitting layer. It is preferred that the light emitting layer contains a host compound (also referred to as a light emitting host) and a light emitting material (also referred to as a light emitting dopant compound), and the light emitting material emits light.

Host Compound

It is preferred the host compound contained in the light emitting layer has a phosphorescence quantum yield of phosphorescence light emission at room temperature (25° C.) of less than 0.1. It is more preferred that the phosphorescence quantum yield is less than 0.01. Further, the volume ratio of the host compound to the compounds contained in the light emitting layer is equal to or greater than 50%.

A single host compound known in the art may be used as the host compound, or a plurality of types of host compounds may also be used. By using a plurality of types of host compounds, it is possible to control migration of charges so as to improve the efficiency of the organic EL elements. Further, by using a plurality of types of light emitting materials as described below, it is possible to mix different light emitting components to obtain various emission colors.

The host compound used in the light emitting layer may be a low-molecular compound known in the art or a polymer compound having a repeating unit or a low-molecular compound (deposition-polymerizable light emitting host) having a polymerizable group such as a vinyl group or an epoxy group.

Examples of host compounds that are applicable to the present invention include the compounds described in JP 2001-257076A, JP 2001-357977 A, JP 2002-8860 A, JP 2002-43056 A, JP 2002-105445 A, JP 2002-352957 A, JP 2002-231453 A, JP 2002-234888 A, JP 2002-260861 A, JP 2002-305083 A, US 2005/0112407A, US 2009/0030202A, WO 2001/039234A, WO 2008/056746A, WO 2005/089025A, WO 2007/063754A, WO 2005/030900A, WO 2009/086028A, WO 2012/023947A, JP 2007-254297A, EP 2034538B and the like.

Light Emitting Material

Representative light emitting materials that can be used in the present invention include phosphorescent compounds (also referred to as phosphorescence emitting compounds, phosphorescent materials or phosphorescent dopants) and fluorescent compounds (also referred to as fluorescence emitting compounds or fluorescent materials).

Phosphorescent Compound

A phosphorescent compound refers to a compound that emits light from the excited triplet state and is specifically defined as a compound that emits phosphorescence at room temperature (25° C.) and has a phosphorescence quantum yield at 25° C. of 0.01 or more. Preferably, the phosphorescence quantum yield is equal to or greater than 0.1.

The phosphorescence quantum yield can be measured by the method described on p. 398 of Experimental Chemistry Lecture 7, Spectroscopy II (fourth edition, 1992, Maruzen). The phosphorescence quantum yield can be measured in a variety of solvents. When a phosphorescent compound is used in the present invention, it is only necessary that its phosphorescence quantum yield in an arbitrary solvent is equal to or greater than 0.01.

The phosphorescent compound may be suitably selected from known compounds that are used in a light emitting layer of general organic EL elements. Preferred are complex compounds that contain a metal of Group 8 to Group 10 in the periodic table of elements. More preferred are iridium compounds, osmium compounds, platinum compounds (platinum complex compounds) and rare earth complexes. Particularly preferred are iridium compounds.

In the present invention, at least one light emitting layer may contain two or more phosphorescent compounds, and the concentration ratio of the phosphorescent compounds in the light emitting layer may vary in the thickness direction of the light emitting layer.

Specific examples of known phosphorescent compounds that can be used in the present invention include the compounds described in the following documents, and the like.

The compounds described in Nature 395, 151(1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991A, WO 2008/101842A, WO 2003/040257A, US 2006/835469A, US 2006/0202194A, US 2007/0087321A, US 2005/0244673A and the like.

Further, the compounds described in Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290A, WO 2009/000673A, U.S. Pat. No. 7,332,232B, US 2009/0039776A, U.S. Pat. No. 6,687, 266B, US 2006/0008670A, US 2008/0015355A, U.S. Pat. No. 7,396,598B, US 2003/0138657A, U.S. Pat. No. 7,090, 928B and the like.

Further the compounds described in Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2006/056418A, WO 2005/123873A, WO 2005/123873A, WO 2006/082742A, US 2005/0260441A, U.S. Pat. No. 7,534,505B, US 2007/0190359A, U.S. Pat. No. 7,338,722B, U.S. Pat. No. 7,279, 704B, US 2006/103874A and the like.

Further, the compounds described in WO 2005/076380A, WO 2008/140115A, WO 2011/134013A, WO 2010/086089A, WO 2012/020327A, WO 2011/051404A, WO 2011/073149A, JP 2009-114086A, JP 2003-81988A, JP 2002-363552A and the like.

Preferred phosphorescent compounds in the present invention include organometallic complexes that contain Ir as the central metal. More preferred are complexes that have coordination of at least one of a metal-carbon bond, a metal-nitrogen bond, a metal-oxygen bond, a metal-sulfur bond.

For example, the above-described phosphorescent compounds (also referred to as phosphorescent metal complexes) can be synthesized by using the methods described in Organic Letter, vol. 3, No. 16, pp. 2579-2581 (2001), Inorganic Chemistry 30, 8, pp. 1685-1687 (1991), J. Am. Chem. Soc., 123, p. 4304 (2001), Inorganic Chemistry, 40, 7, pp. 1704-1711 (2001), Inorganic Chemistry, 41, 12, pp. 3055-3066 (2002), New Journal of Chemistry., 26, p. 1171 (2002), European Journal of Organic Chemistry, 4, pp. 695-709 (2004), references cited in these documents, and the like.

Fluorescent Compound

Examples of fluorescent compounds include coumarin colorants, pyran colorants, cyanine colorants, croconium colorants, squarylium colorants, oxobenzanthracene colorants, fluorescein colorants, rhodamine colorants, pyrylium colorants, perylene colorants, stilbene colorants, polythiophene colorants, rare earth complex phosphors and the like.

Organic Functional Layer Unit

Next, the charge injection layer, the hole transport layer, the electron transport layer and the blocking layer, which are the layers of the organic functional layer unit other than the light emitting layer, will be described in the written order.

Charge Injection Layer

The charge injection layer is provided between the electrodes and the light emitting layer to decrease the driving voltage and to improve the emission brightness. Details are described in "Organic EL Elements and Front Line of the Industrialization Thereof" 2nd edition, Chapter 2 "Electrode Material", pp. 123-166 (issued on Nov. 30, 1998 by NTS Corp). The charge injection layer can be a hole injection layer or an electron injection layer.

Typically, the charge injection layer as a hole injection layer can be present between the positive electrode and the light emitting layer or hole transport layer, and the charge injection layer as an electron injection layer can be present between the negative electrode and the light emitting layer or electron transport layer. In the present invention, it is preferred to dispose the charge injection layer adjacent to the transparent electrode.

The hole injection layer is disposed adjacent to the transparent positive electrode to reduce the driving voltage and to improve the emission brightness. Details are described in "Organic EL Elements and Front Line of the Industrialization Thereof" 2nd edition, Chapter 2 "Electrode Material", pp. 123-166 (issued on Nov. 30, 1998 by NTS Corp).

Details of the hole injection layer are also described in JP H09-45479A, JP H09-260062A, JP H08-288069A and the like. Examples of materials that are used in the hole injection layer include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyaryl alkane derivatives, triaryl amine derivatives, carbazole derivatives, indolocarbazone derivatives, isoindole derivatives, acene derivatives such as anthracene and naphthalene, fluorene derivatives, fluorenone derivatives, polyvinyl carbazole, polymer or oligomer materials having an aromatic amine introduced on the main chain or a side chain, polysilane, conductive polymers or oligomers (e.g. PEDOT (polyethylene dioxythiophene): PSS (polystyrene sulfonic acid), aniline copolymers, polyaniline, polythiophene, etc.) and the like.

Examples of such triaryl amine derivatives include benzidine-type compounds such as α-NPD(4,4'-bis{N-(1-naphtyl)-N-phenylamino}biphenyl), star burst-type compounds such as MTDATA (4,4',4''-tris{N-(3-methylphenyl)-N-phenylamino}triphenylamine, compounds having a fluorene or anthracene at a triarylamine-coupled core, and the like.

Further, hexaazatriphenylene derivatives such as those described in JP 2003-519432A and JP 2006-135145A can also be used as hole transport materials similarly.

The electron injection layer is provided between the negative electrode and the light emitting layer to decrease the driving voltage or to improve the emission brightness. When the negative electrode is constituted by the transparent electrode of the present invention, the electron injection layer is disposed adjacent to the transparent electrode. Details are described in "Organic EL Elements and Front Line of the Industrialization Thereof" 2nd edition, Chapter 2 "Electrode Material", pp. 123-166 (issued on Nov. 30, 1998 by NTS Corp).

Details of the electron injection layer are also described in JP H06-325871A, JP H09-17574A, JP H10-74586A and the like. Specific examples of materials that are preferably used in the electron injection layer include metals such as strontium and aluminum, alkaline metal compounds such as lithium fluoride, sodium fluoride and potassium fluoride, alkaline metal halide layers such as magnesium fluoride and calcium fluoride, alkaline earth metal compound layers such as magnesium fluoride, metal oxides such as molybdenum oxide and aluminum oxide, metal complexes such as lithium 8-hydroxyquinolate (Liq) and the like. When the negative electrode is transparent, organic materials such as metal complexes are particularly preferably used. It is desired that the electron injection layer is a very thin film. The layer thickness is preferably within the range of 1 nm to 10 µm depending on the material.

Hole Transport Layer

The hole transport layer is made of a hole transport material that has a function of transporting holes. In a broad sense, the hole injection layer and the electron blocking layer also have the function of the hole transport layer. It is possible to provide a single or a plurality of hole transport layers.

The hole transport material has a function of injecting or transporting holes or blocking electrons. The hole transport material may be either organic or inorganic material. Examples of such materials include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorene derivatives, hydrazone derivatives, stilbene derivatives, silazane derivatives, aniline copolymers, conductive oligomers, thiophene oligomers and the like.

In addition to the above-described materials, porphyrin compounds, aromatic tertiary amine compounds and styrylamine compounds can also be used as the hole transport materials. It is particularly preferred to use aromatic tertiary amine compounds.

Representative examples of such aromatic tertiary amine compounds and styrylamine compounds include N,N,N',N'-tetraphenyl-4,4'-diaminophenyl, N,N'-diphenyl-N,N'-bis(3-methylphenyl)-{1,1'-biphenyl}-4,4'-diamine (abbreviated as TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether4,4'-, bis(diphenylamino)quadryphenyl, N,N,N-tri(p-tolyl)amine, 4-(di-p-tolylamino)-4'-{4-(di-p-tolylamino)styryl}stilbene, 4-N,N-diphenylamino-(2-diphenylvinyl)benzene, 3-methoxy-4'-N,N-diphenylaminostilbenzene, N-phenylcarbazole, and the like.

To form the hole transport layer, the hole transport material as described above can be shaped into thin film by a method known in the art such as vacuum deposition, spin coating, casting, printing including ink-jetting or the LB method (Langmuir-Blodgett method). The layer thickness of the hole transport layer is not particularly limited. However, it is typically within the range of approximately 5 nm to 5 µm, preferably 5 nm to 200 nm. The hole transport layer may be constituted by a single layer made of one or more of the above-described materials.

By doping an impurity to the material of the hole transport layer, it is possible to increase the p-type characteristic. Examples thereof are described in JP H04-297076A, JP 2000-196140, JP 2001-102175A and J. Appl. Phys., 95, 5773 (2004) and the like.

It is preferred to increase the p-type characteristic of the hole transport layer since it becomes possible to produce the organic EL elements with lower power consumption.

Electron Transport Layer

The electron transport layer is made of a material that has a function of transporting electrons. In a broad sense, the electron injection layer and the hole blocking layer are included in the electron transport layer. The electron transport layer has a single layer structure or a laminated structure of layers.

In the electron transport layer having a single layer structure or a laminated structure, the electron transport material (which also serves as a hole blocking material) of the portion adjacent to the light emitting layer has a function of transmitting electrons injected from the cathode (negative electrode) to the light emitting layer. Such a material can be arbitrarily selected from compounds known in the art. Examples of such materials include nitro-substituted fluorene derivatives, diphenylquinone derivatives, thiopyrandioxide derivatives, carbodiimido, fluorenylidenemethane derivatives, anthraquinodimethane, anthrone derivatives, oxadiazole derivatives and the like. Further, materials that can also be used for the electron transport layer include thiadiazole derivatives that are obtained by substituting the oxygen atom of the oxadiazole ring of the above-described oxadiazole derivatives with a sulfur atom, and quinoxaline derivatives having a quinoxaline ring known as an electron-withdrawing group. Further, materials that can also be used include polymer materials in which these materials are introduced to the polymer chain and polymer materials having a main chain of these materials.

Furthermore, materials that can also be used for the electron transport layer include metal complexes of 8-quinolinol derivatives, e.g. tris(8-quinolinol)aluminum (abbreviated as $Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (abbreviated as Znq) and the like, and other metal complexes which are obtained by replacing the central metal of these metal complexes with In, Mg, Cu, Ca, Sn, Ga or Pb.

To form the electron transport layer, the material as described above can be shaped into thin film by a method known in the art such as by vacuum deposition, spin coating, casting, printing including ink-jetting and the LB method.

The layer thickness of the electron transport layer is not particularly limited. However, it is typically within the range of approximately 5 nm to 5 µm, preferably 5 nm to 200 nm. The electron transport layer may be constituted by a single layer made of one or more materials as described above.

Blocking Layer

The blocking layer, which is a hole blocking layer or an electron blocking layer, is provided in addition to the above-described layers of the organic functional layer unit 5 according to need. Examples of such layers include the hole blocking layers described in JP 11-204258A, JP 11-204359A, "Organic EL Elements and Front Line of the Industrialization Thereof", p. 237 (issued on Nov. 30, 1998 by NTS Corp).

In a broad sense, the hole blocking layer has the function of the electron transport layer. The hole blocking layer is made of a hole blocking material that has a function of transporting electrons but is very poor in the capability of transporting holes. The hole blocking layer blocks holes while transporting electrons so as to improve the probability of recombination of electrons and holes. The same configuration as that of the electron transport layer can be used for the hole blocking layer according to need. It is preferred that the hole blocking layer is disposed adjacent to the light emitting layer.

In a broad sense, the electron blocking layer has the function of a hole transport layer. The electron blocking layer is made of a material that has a function of transporting electrons but is very poor in the capability of transporting electrons. The electron blocking layer blocks electrons while transporting holes so as to improve the probability of recombination of electrons and holes. The same configuration as that of the hole transport layer can be employed for the electron blocking layer according to need. The layer thickness of the hole blocking layer of the present invention is preferably within the range of 3 nm to 100 nm, more preferably within the range of 5 nm to 30 nm.

Negative Electrode

The negative electrode has a function of supplying holes to the organic functional layer unit or the light emitting layer. A metal, an alloy, an organic or inorganic conductive compound or a mixture thereof is used as the negative electrode. Specific examples include gold, aluminum, silver, magnesium, lithium, magnesium/copper mixture, magnesium/silver mixture, magnesium/aluminum mixture, magnesium/indium mixture, indium, lithium/aluminum mixture, rare earth metals, oxide semiconductors such as ITO, ZnO, $TiO_2$ and $SnO_2$, and the like.

To produce the negative electrode, the conductive material as described above can be formed into thin film by vapor deposition, sputtering or the like. The sheet resistance as the second electrode is preferably equal to or less than several hundred Ω/sq. The film thickness is selected within the range of typically 5 nm to 5 µm, preferably 5 nm to 200 nm.

When the organic EL elements are double-sided elements, which allows extracting emission light L also from the negative electrode side, a negative electrode with high optical transparency can be selected.

Sealing Member

As for the sealing means for sealing the organic EL elements, an example method involves bonding the sealing member (8) to the negative electrode (6) and the transparent substrate (3) with the sealing adhesive (7) as illustrated in FIG. 2.

The sealing member (8) have any shape such as a recessed plate or a flat plate that covers the display area of the organic EL elements. The transparency and the electrical insulation are not particularly limited.

Specific examples include glass plate, polymer plate, film, metal plate, film and the like. Such glass plates particularly include soda lime glass, barium-strontium containing glass, lead glass, aluminosilicate glass, borosilicate glass, barium borosilicate glass, quartz and the like. Such polymer plates include polycarbonate, acryl, polyethylene terephthalate, polyether sulfide, polysulfone and the like. Such metal plates include one or more metals selected from the group consisting of stainless steel, iron, copper, aluminum, magnesium, nickel, zinc, chromium, titanium, molybdenum, silicon, germanium, tantalum and the alloys thereof.

A polymer film or a metal film can be suitably used as the sealing member (8) since it allows reducing the thickness of the organic EL elements. It is preferred that the polymer film has a water vapor transmission rate measured at a temperature of 25±0.5° C. and a relative humidity of 90±2% RH by a method according to JIS K 7129-1992 of $1 \times 10^{-3}$ g/m²·24 h or less. It is more preferred that the polymer film has an oxygen transmission rate measured by a method according to JIS K 7126-1987 of $1 \times 10^{-3}$ ml/m²·24 h·atm (1 atm=$1.01325 \times 10^5$ Pa) or less and a water vapor transmission rate measured at a temperature of 25±0.5° C. and a relative humidity of 90±2% RH of $1 \times 10^{-3}$ g/m²·24 h or less.

Examples of the sealing adhesive (7) include photocurable or thermoset adhesives having a reactive vinyl group such as acrylate oligomers and methacrylate oligomers, moisture-curable adhesives such as 2-cyanoacrylate, and the like. Further examples include thermo- or chemical-curable (two-pack) adhesives such as epoxy adhesives. Further examples also include hot-melt adhesives of polyamides, polyesters and polyolefins. Further examples also include ultraviolet-curable epoxy resin adhesives that cure by cation polymerization.

In addition to the sealing adhesive (7), a gap between the sealing member and the display area (light emitting area) of the organic EL elements may be filled with inert gas such as nitrogen or argon or inert liquid such as fluorinated hydrocarbon or silicone oil. Further, the gap between the sealing member and the display area of the organic EL elements may be vacuumed or filled with a hydroscopic compound.

Method for Producing Organic EL Element

With regard to the production method, the organic EL elements can be formed by laminating the positive electrode, the organic functional layer unit including the light emitting layer and the negative electrode on the transparent substrate.

First, the transparent substrate is prepared. On the transparent substrate, a desired electrode material, e.g. a thin film of a positive electrode material, is formed to a film thickness of 1 µm or less, preferably within the range of 10 nm to 200 nm by vapor deposition, sputtering or the like. The positive electrode is thus formed. At the same time, a connector electrode for connection with an external power supply is formed at an end of the positive electrode.

Then, the hole injection layer, the hole transport layer, the light emitting layer and the electron transport layer and the like are sequentially laminated thereon as the organic functional layer unit.

The organic functional layers can be formed by spin coating, casting, ink-jetting, vapor deposition, printing or the like. Vacuum deposition and spin coating are particularly preferred since pinholes are less likely to be formed. Different forming methods may be used depending on the individual layers. When vapor deposition is employed for forming the layers, the conditions of the vapor deposition are suitably selected depending on the type of compounds used and the like. Typically, it is desirable that the boat heating temperature is within the range of 50° C. to 450° C., the degree of vacuum is within the range of $1\times10^{-6}$ to $1\times10^{-2}$ Pa, the deposition rate is within the range of 0.01 nm/sec to 50 nm/sec, the substrate temperature is within the range of −50° C. to 300° C., and the layer thickness is within the range of 0.1 µm to 5 µm.

After the organic functional layer unit is thus formed, the negative electrode is formed thereon by a suitable method such as vapor deposition or sputtering. The negative electrode is formed so that a terminal portion protrudes to the peripheral edge of the transparent substrate from the top of the organic functional layer unit, and the negative electrode is insulated from the positive electrode by the organic functional layer unit.

After the negative electrode is formed, the transparent substrate, the positive electrode, the organic functional layer unit including the light emitting layer, and the negative electrode are sealed with the sealing member. That is, the sealing member is provided on the transparent substrate to cover at least the organic functional layer unit but to expose the terminal portions of the positive electrode and the negative electrode.

In the production of the organic EL panel, for example, the electrodes of the organic EL elements are electrically connected to the light emitting element drive circuit unit (12) and the touch detection circuit unit (14). The connecting member for forming the electrical connection is not particularly limited and may be made of any conductive material. Preferred examples are anisotropic conductive film (ACF), conductive paste or metal paste.

An example of such anisotropic conductive film (ACF) is an electrically conductive layer that contains conductive fine particles mixed with a thermoset resin. The conductive particle-containing layer that can be used in the present invention is not particularly limited and may be any layer that contains conductive particles as an anisotropic conductive member, and a suitable layer is selected according to the purpose. The conductive particles that can be used in the anisotropic conductive member of the present invention are not particularly limited and suitably selected according to the purpose. Such particles include metal particles, metal-coated resin particles and the like. Examples of commercially available ACFs include low temperature-curable ACFs that can also be used for resin film such as MF-331 (Hitachi Chemical Co., Ltd.).

Examples of metal particles include nickel, cobalt, silver, copper, gold, palladium and the like. Examples of the metal-coated resin particles include particles that are produced by coating resin cores with any metal of nickel, copper, gold and palladium. Examples of metal paste include commercially available metal nanoparticle paste and the like.

Applicable Field of Organic EL Module

The organic electroluminescence module of the present invention, which enables the small format, a reduction in thickness and simplification of the process, is suitably applicable to a variety of smart devices such as smartphones and tablets and illumination devices.

Smart Device

Figure 19:
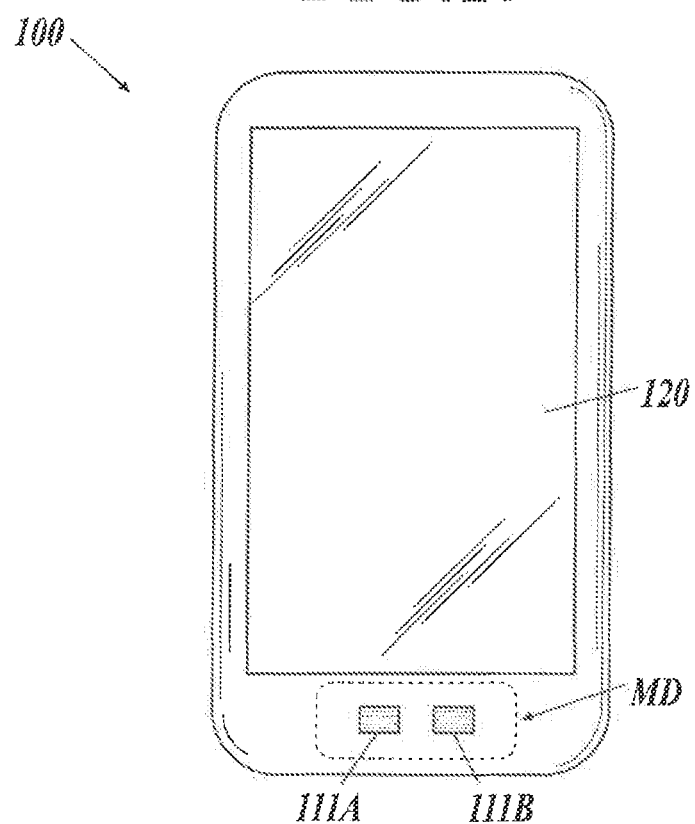
FIG. 19 is a schematic configuration view of an example of a smart device that includes the organic electroluminescence module of the present invention.

FIG. 19 is a schematic configuration view of an example of a smart device (100) that includes the organic EL module of the present invention in an icon area. The organic EL module of the present invention is also applicable to a main screen and the like as well as the icon area.

The smart device (100) of the present invention includes the organic electroluminescence module (MD) having the multi-touch detecting function as described in FIG. 4 to FIG. 18, a liquid crystal display device (120) and the like. A liquid crystal display device known in the art can be used as the liquid crystal display device (120).

FIG. 19 illustrates a state in which the two organic EL elements of the organic electroluminescence module (MD) of the present invention emit light, and light emission from the two touch detecting portions (111A and 111B) is visibly recognizable in a front view. The display pattern (111A and 111B) in FIG. 19 is an example for the multi-touch function. The display pattern is not limited thereto, and may have any shape, text, pattern or the like. As used herein, the "display pattern" refers to a design (figure or pattern), a text, an image and the like that are displayed by light emission of the organic EL elements.

Illumination Device

The organic electroluminescence module of the present invention is also applicable to illumination devices. Illumination devices to which the organic electroluminescence module of the present invention is suitably applicable include home lighting, car lighting, and display devices such as back lights of liquid crystal display devices. Further, the organic electroluminescence module of the present invention has a wide range of applications such as back lights of watches, signs and advertisement, traffic signals, light sources of optical storages and the like, light sources of electrophotographic copiers, light sources of optical communication processing devices, light sources of optical sensors and general home appliances that require a display device.

Although embodiments of the present invention have been described and illustrated in detail, it is clearly understood that the same is by way of illustration and example only and not limitation, the scope of the present invention should be interpreted by terms of the appended claims.

INDUSTRIAL APPLICABILITY

The organic electroluminescence module of the present invention, which enables the small format, a reduction in thickness and simplification of the process, is suitably applicable to a variety of smart devices such as smartphones and tablets and illumination devices.

REFERENCE SIGNS LIST

1, MD Organic EL module
2 Organic EL panel
3 Transparent substrate
4A, 4B Anode electrode
5 Organic functional layer unit
6 Cathode electrode
7 Sealing adhesive
8 Sealing member
10 Conventional touch detection electrode
11 Cover glass
12 Light emitting element drive circuit unit
14 Touch detection circuit unit
15 Finger
16 Ground (Earth)
21A, 21B Capacitor (Cel)
22A, 22B Organic EL element
23 Light emitting element drive circuit section
24A, 24B Touch detection circuit section
25A, 25B Anode electrode wiring 26 Cathode electrode wiring
27, 27A, 27B Ground
28A, 28B Light emission control information route
29A, 29B, 29C Touch detection information route
31, Cs1, Cs2, Cs3 Capacitor (Cs)
100 Smart device
111A, 111B Display pattern
120 Liquid crystal display device
1FT Unit frame period
Cf Capacitance during finger contact
LT Light emission period
ST Touch detection period
SW1 Switch 1
SW2 Switch 2
SW3 Switch 3
SW4 Switch 4
SW5 Switch 5
SW6 Switch 6
t Waiting time
τ OLED charge-discharge time constant

The invention claimed is:

1. An organic electroluminescence module having a touch function of detecting contact or proximity of an operation body, comprising:
    a touch detection circuit unit comprising a capacitance touch detection circuit section; and
    a light emitting element drive circuit unit comprising a light emitting element drive circuit section which drives an organic electroluminescence panel,
    wherein
    the organic electroluminescence panel comprises light emitting areas and a pair of at least two plate electrodes that are internally and mutually opposed,
    the pair of electrodes is connected to the light emitting element drive circuit unit, one of the pair of electrodes is a touch detection electrode,
    both or either one of the pair of electrodes is connected to the touch detection circuit unit,
    a first electrode of the pair of electrodes is divided into portions while a second electrode of the pair of electrodes is a single piece,
    a same potential is applied at least to the divided portions of the first electrode during a touch detection period,
    a light emission period of the organic electroluminescence panel under control of the light emitting element drive circuit section and the touch detection period under control of the touch detection circuit section are separated from each other, and
    the second electrode and the divided portions of the first electrode are each connected to the light emitting element drive circuit unit by respective first switches and the second electrode and the divided portions of the first electrode are each connected to the touch detection circuit unit by respective second switches, which are separate from the first switches, the first switches are closed and the second switches are open during the light emission period and the first switches are open and the second switches are closed during the touch detection period.

2. The organic electroluminescence module according to claim 1, wherein the same potential is applied to all of the divided portions of the first electrode and the single piece of the second electrode during the touch detection period.

3. The organic electroluminescence module according to claim 1, wherein the first electrode, which is divided into the portions, is the touch detection electrode.

4. The organic electroluminescence module according to claim 1, wherein a capacitance of the organic electroluminescence panel is undetectable during the touch detection period.

5. The organic electroluminescence module according to claim 1, wherein
    at least one of the pair of the electrodes is at a floating potential during the touch detection period so that a capacitance of the organic electroluminescence panel is undetectable, and the other of the pair of electrodes is at the same potential.

6. The organic electroluminescence module according to claim 1, wherein
    the pair of electrodes is at the same potential during the touch detection period so that a capacitance of the organic electroluminescence panel is undetectable.

7. The organic electroluminescence module according to claim 1, wherein the organic electroluminescence module is driven such that the organic electroluminescence panel is controlled by the light emitting element drive circuit section to continuously emit light while the touch detection period under control of the touch detection circuit section periodically appear.

8. The organic electroluminescence module according to claim 1, wherein a light emission period comprises a reverse voltage applying period at an end.

9. A smart device comprising the organic electroluminescence module according to claim 1.

10. An illumination device comprising the organic electroluminescence module according to claim 1.

* * * * *